(12) United States Patent
Uber, III et al.

(10) Patent No.: US 6,414,318 B1
(45) Date of Patent: Jul. 2, 2002

(54) ELECTRONIC CIRCUIT

(75) Inventors: Arthur E. Uber, III, Pittsburgh; Joshua J. Ziff, Murrysville; Robert E. Uber, Allison Park, all of PA (US)

(73) Assignee: Bridge Semiconductor Corporation, Pittsburgh, PA (US)

( * ) Notice: Subject to any disclaimer, the term of this patent is extended or adjusted under 35 U.S.C. 154(b) by 0 days.

(21) Appl. No.: 09/187,470

(22) Filed: Nov. 6, 1998

(51) Int. Cl.[7] .............................................. G01T 1/185

(52) U.S. Cl. ..................... 250/389; 250/250; 250/370.01

(58) Field of Search ................................ 250/389, 250, 250/388, 370.01, 374, 370.09

(56) References Cited

U.S. PATENT DOCUMENTS 3,639,841 A * 2/1972 Richardson .................. 325/363
3,896,309 A    7/1975 Halsor et al. ................ 250/211

(List continued on next page.)

OTHER PUBLICATIONS

Book entitled "Operational Amplifiers", Burr–Brown Corporation @ 1971, Published by McGraw–Hill Book Company "Operational Amplifiers—Design and Applications" by Tobey, Graeme & Huelsman, pp. 201–235, Copyright 1971, ISBN 07–064917–0, Library of Congress 74–163297.
Book entitled "Capacitative Sensors", Institute of Electronical and Electronics Engineers, Inc. @1997 "Capacitive Sensors—Design and Applications" by Larry K. Baxter, pp. 3–5, Copyright 1997, ISBN 0–7803–1130–2.
Book entitled "Nuclear Radiation Detection", McGraw–Hill Book Company, Copyright 1958, 1964 (6 pages) "Background of the Invention": "Nuclear Radiation Detection" by William J. Price, pp. 82–83 & pp. 407–409, 2nd Edition, Copyright 1964, Library of Congress 63–23463.
IEEE Transactions on Nuclear Science, vol. NS–31, No. 1, Feb. 1884 (4 pages).
Motorola Semiconductor Technical Data information sheet entitled Low–Power CMOS Ionization Smoke Detector with Interconnect (6 pages).

*Primary Examiner*—Constantine Hannaher
*Assistant Examiner*—Otilia Gabor
(74) *Attorney, Agent, or Firm*—Cohen & Grigsby, P.C.

(57) ABSTRACT

The present invention relates to an electronic circuit for measuring small amounts of charge or small electrical currents. One embodiment of the present invention provides an electronic circuit for measuring current or charge that can be used with a variety of sensing media (including high impedance sensing media) that produce a signal by either charge or current production or induction in response to physical phenomena occurring within the sensing media. In another embodiment, the voltage level (bias) of either the sensing or reference electrode can be switched relative to the other upon receipt of a triggering pulse. This changes the polarity of the electric field to cause charge of the opposite polarity to be driven to the sensing electrode, thereby eliminating the need to electrically connect a discharge path to the sensing electrode to clear the charge accumulated at the sensing electrode. This can be supplemented by capacitively coupling a compensation signal to the sensing electrode to cause the amplifier output signal to lessen in magnitude below a threshold level that permits additional charge or current measurements of the same polarity before performing bias reversal. Alternately or in combination with bias reversal and capacitive compensation, sensor performance can be improved by minimizing inaccuracies caused by leakage currents or current drawn from the sensor. Other methods of reducing leakage currents that can be used alone or in combination with the aforementioned features include the use of guard rings, physical switches or relays, the controlled creation of charges or currents of a specific polarity in a specific region of the sensing medium, controlled leakage over the surface of an insulator, and controlling the environment in which the circuit operates.

125 Claims, 20 Drawing Sheets

U.S. PATENT DOCUMENTS

| | | | |
|---|---|---|---|
| 4,087,692 A | 5/1978 | Lecuyer et al. | 250/370 |
| 4,152,595 A | 5/1979 | Garfinkel et al. | 307/305 |
| 4,251,829 A | 2/1981 | Adam | 357/23 |
| 4,258,259 A | 3/1981 | Ohara et al. | 250/338 |
| 4,262,203 A | 4/1981 | Overhoff | 250/374 |
| 4,367,948 A | 1/1983 | Suzuki | 355/14 |
| 4,529,884 A | 7/1985 | Wolicki et al. | 250/370 |
| 4,605,946 A | 8/1986 | Robinson, Jr. | 357/23.1 |
| 4,626,687 A | 12/1986 | Nara et al. | 250/338 |
| 4,675,739 A | 6/1987 | Catchpole et al. | 358/213.11 |
| 4,707,608 A * | 11/1987 | DiBianca | 250/389 |
| 4,769,547 A | 9/1988 | Uber, III | 250/374 |
| 4,788,581 A | 11/1988 | Knoll et al. | 357/29 |
| 4,804,847 A | 2/1989 | Uber, III | 250/389 |
| 4,804,909 A | 2/1989 | Fink | 324/320 |
| 4,912,660 A * | 3/1990 | Kuipers et al. | 364/550 |
| 4,963,747 A * | 10/1990 | Thacker | 250/389 |
| 4,970,391 A | 11/1990 | Uber, III | 250/374 |
| 4,996,576 A | 2/1991 | Lynch et al. | 357/29 |
| 5,053,624 A | 10/1991 | Kronenberg | 250/385.1 |
| 5,059,803 A | 10/1991 | Kronenberg | 250/255 |
| 5,065,031 A | 11/1991 | Moscovitch | 250/486.1 |
| 5,117,113 A | 5/1992 | Thomson et al. | 250/370.07 |
| 5,153,502 A | 10/1992 | Morgan et al. | 324/123 |
| 5,192,990 A | 3/1993 | Stevens | 257/229 |
| 5,235,195 A | 8/1993 | Tran et al. | 257/59 |
| 5,294,817 A | 3/1994 | Yamamoto | 257/249 |
| 5,332,903 A | 7/1994 | Buehler et al. | 250/370.14 |
| 5,461,425 A | 10/1995 | Fowler et al. | 348/294 |
| 5,479,022 A | 12/1995 | Simon, Jr. | 250/382 |
| 5,500,534 A | 3/1996 | Robinson et al. | 250/385.1 |
| 5,528,043 A | 6/1996 | Spivey et al. | 250/370.09 |
| 5,539,319 A | 7/1996 | Yamada | 324/458 |
| 5,572,118 A | 11/1996 | Lewis | 324/123 |
| 5,583,444 A | 12/1996 | Nakamura et al. | 324/750 |
| 5,665,966 A | 9/1997 | Dehl et al. | 250/281 |
| 5,666,105 A | 9/1997 | Adler et al. | 340/600 |
| 5,688,698 A | 11/1997 | Robinson et al. | 437/3 |
| 5,719,502 A | 2/1998 | Verbiest et al. | 324/457 |
| 5,739,541 A | 4/1998 | Kahilainen | 250/370.07 |
| 5,770,956 A | 6/1998 | Rolff | 327/103 |
| 6,034,373 A * | 3/2000 | Shahar et al. | 250/370.01 |
| 6,069,360 A * | 5/2000 | Lund | 250/370.01 |
| 6,075,256 A * | 6/2000 | Kaifu et al. | 250/370.09 |

* cited by examiner

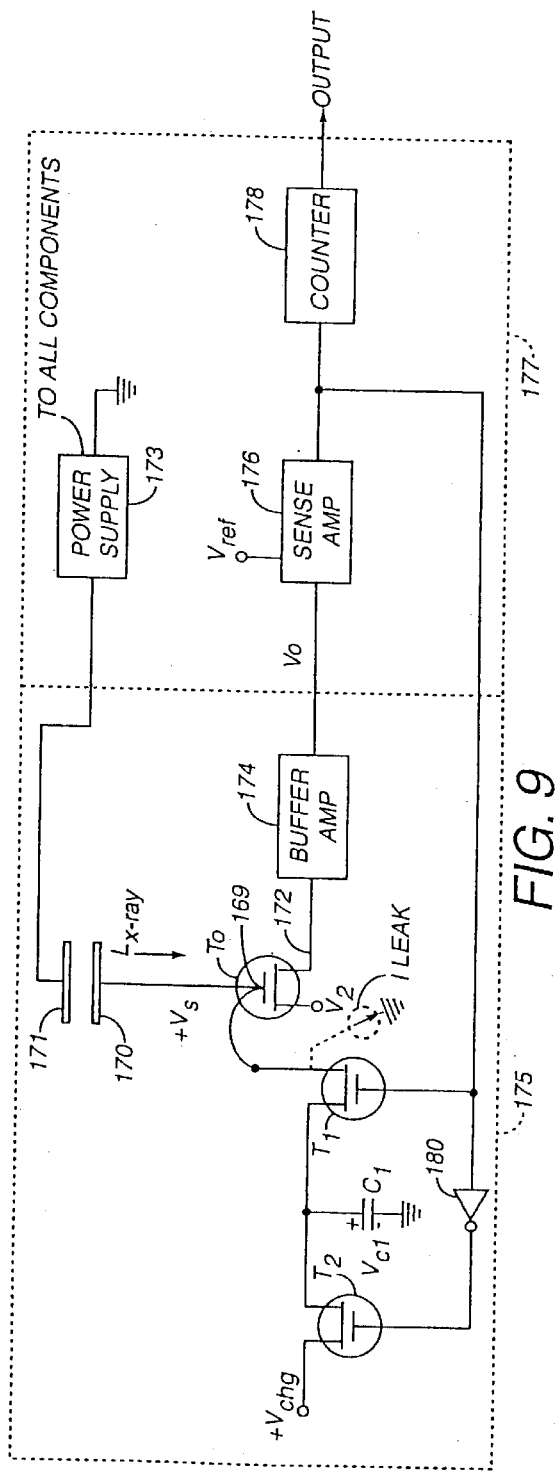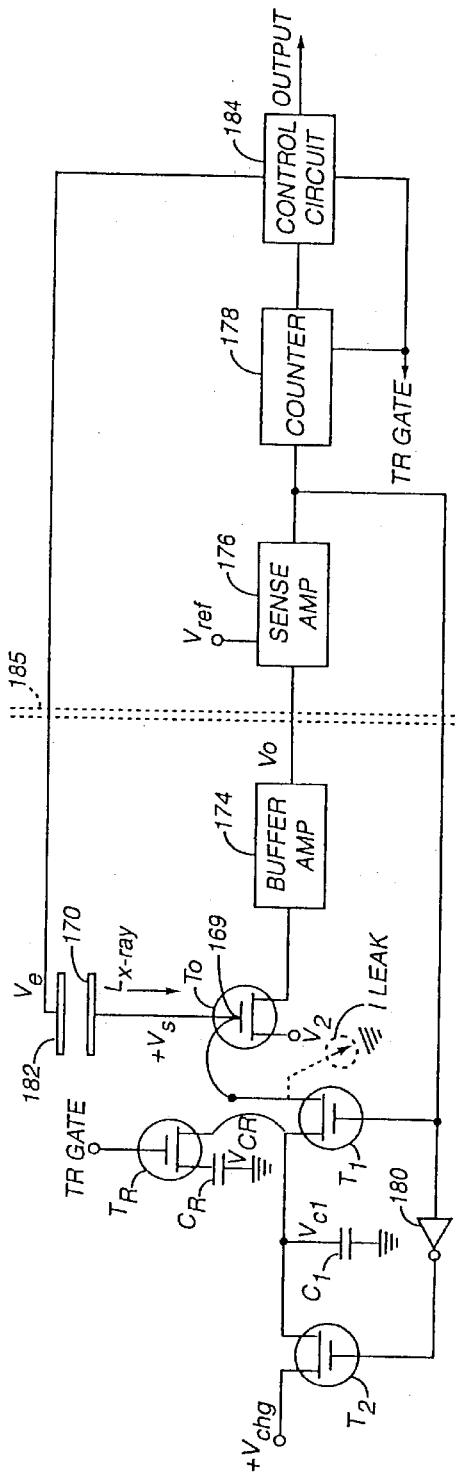
FIG. 9
FIG. 10

ELECTRONIC CIRCUIT

FIELD OF THE INVENTION

The present invention relates to an electronic circuit for measuring small amounts of charge or small electrical currents.

BACKGROUND OF THE INVENTION

Often the measurement of a physical phenomena involves the creation of an electrical signal which is amplified and measured by an electrical circuit. A number of sensing media face limitations, imposed by the electronic measuring circuits, on their ability to measure physical phenomena. These media include solids, liquids, or gases in which the physical phenomena to be sensed causes the generation of mobile charges which then move under the influence of an electric field, or in which a charge separation is induced by the physical phenomena and/or dimensional changes in the sensing medium. Specific examples of sensing media are gases in the case of ionizing radiation, electrochemical mixtures, electret or capacitive microphones, variable capacitors, inductive pickups or coils, electric field measuring antennas, piezoelectric materials such as PVDF, semiconductors operated at temperatures where thermally-induced current generation is not dominant, a vacuum in the case of electron emissive surfaces or ion mobility instruments, and insulators. The limitations imposed by the measuring circuits include sensitivity, linearity, size, dynamic range, and operating voltages. These limitations arise from thermally-induced and/or bias currents in the components of the measuring circuit and current leakage paths over the surfaces of and/or through the components of the measuring circuit. The measuring circuit described herein aims to minimize these limitations.

One example of a physical phenomena is ionizing radiation. It presents a direct hazard to people; therefore, the measurement of radiation in various environmental settings is important. The type of radiation monitor or detector used to measure the radiation depends upon the type of radiation, e.g., beta, alpha, or X-ray and the environmental setting, e.g., an environmentally isolated laboratory, an open mine, or a waste dump holding potentially hazardous material. Different environments impose different requirements on the manner and sensitivity of the measurement; for example, the laboratory most likely requires a monitoring system with a continuous display and singular or multiple radiation detectors; the mine requires a moderately sensitive portable area detector; and the waste dump a relatively fast and sensitive directional detector.

D. A. Waechter et al. described in an article entitled "New Generation Low Power Radiation Survey Instruments," a standard portable dosimeter (radiation monitor) system. The portable monitor consists of a Geiger-Muller tube (GM tube) with an event counter which records the number of ionizing events. There is a readout display and an audio alarm. The problem with the GM tube is that its response is not linear with the energy of the radiation so its accuracy varies with radiation photon energy, although it is useful for warning. In this instrument, the need to amplify the radiation signal in the GM tube limits the energy linearity and thus the accuracy of the instrument. An ion chamber made from tissue equivalent plastic and filled with a tissue equivalent gas gives a very accurate reading. However, at low doses and dose rates, the amount of charge generated per unit volume of gas is very small. For accurate measurement of the ionizing radiation, the signal current created by the ionizing radiation needs to be significant when compared to the leakage and/or noise currents in the electronic measuring circuit and the internal leakage currents in the gas sensing medium. It is preferred that the signal current be greater than the sum of all the leakage and noise currents. In general, the internal leakage currents of the sensing media, which are induced by physical phenomena other than the one to be measured, must be on the same order of magnitude or preferably less than the currents created by the physical phenomena to be measured in order for any measuring circuit, including the ones described herein, to obtain a measurement. Sensing media with low internal leakage currents are said to have high internal impedances. Gas is a very high impedance sensing medium and so does not contribute significant internal leakage currents. But, due to surface leakage currents on insulators and other circuit elements and due to other limitations within the implementing circuitry, prior art ion chambers tend to need a large volume of gas, and thus operate at high pressure or be inconveniently large, and need to employ high voltages to be sufficiently sensitive. By significantly reducing surface leakage currents and bias currents, this invention allows accurate ionizing radiation measurement with lower voltages and smaller chambers.

A second group of sensors that can benefit from the invention disclosed herein are charge inducing sensors such as capacitive sensors, where a charge is induced if the voltage difference is kept constant, or where a voltage is induced if the charge stays constant. Capacitive sensors can be used in many applications such as, microphones, pressure measurements, and accelerometers to name a few. Books like *Capacitive Sensors Design and Application* by Larry K. Baxter (ISBN 0-7803-1130-2) give many applications, some examples of which are given on pages 3–5. It is important to note that in capacitive sensors there is a high impedance material, often gas, but sometimes a liquid or a solid, between the capacitor electrodes. In this type of sensor the high impedance material is functioning as a separating medium rather than a sensing medium. The sensing medium is the capacitor plates themselves and the separation between them. There is not meant to be charge conduction through the separating medium. For this reason the term non-mobile charges can be used. The induced charges do move within the conductors connected to the sensing electrodes and the other electrodes, but they do not move through the separating medium. Most prior art capacitive sensors are limited to alternating current (AC) use because of the bias and leakage currents introduced by the prior art measurement electronics or within or over the surfaces of the capacitive sensors themselves. Among the limitations are: (i) response time, since it takes several cycles of the AC signal for a change to be noticed, (ii) power use, because the AC signal require an AC source and constant current draw, and (iii) sensitivity, because the measurement is a small change of a large AC signal.

Another group of charge sensors which can benefit from the invention is electrochemical sensors, where the phenomena to be measured interacts via a reversible or irreversible chemical reaction that causes the formation of charge in electrical dipole layers. The charges need not be mobile because the creation of an electric field by the induced charge distribution will result in a signal which can be measured. In some configurations, electrochemical sensors are low impedance sensors, with significant internal leakage currents inherent in the medium itself. Some water-based electrochemical cells are examples of this. Even in low internal impedance sensors, there may be a sensitivity or linearity benefit from using an electronic circuit which does not load or draw much current from the sensor. In some configurations, the current generated is the electrical signal which most directly relates to the physical phenomena. In other configurations, electrochemical sensors produce a voltage that is measured to represent the physical phenomena. The measurement of work function difference between two surfaces with an insulating medium as a separation material is an example of this. One prior art method for measuring work function difference is a moving plate or vibrating reed electrometer as described in pages 82–83 and pages 407–409 of Nuclear Radiation Detection by William J. Price (Second Edition, Library of Congress Catalog Card Number 63–23463). In this device, mechanically moving or vibrating a capacitor plate induces an alternating current proportional to the voltage difference between the two plates and the time rate of change of the capacitance, $I=V*(dC/dt)$. While this circuit is very sensitive, its usefulness is limited because of the size of the vibrating plates and the power needed to create the vibration or motion. A vibrating reed electrometer is different than the capacitive sensors because in the capacitive sensors, the change in capacitance is related to the phenomena to be measured, while in a vibrating reed electrometer, the capacitance change is periodic and is used to amplify the voltage difference and convert it into a current.

Another set of applications in which the invention may be used are mass spectrometers, flame ionization detectors, vacuum gauges, gas chromatographs, photodetector tubes, and others where charged ions or electrons are moving in a vacuum. These can be termed free electron detectors, although ions of both positive and negative charge may be collected, as well as free electrons. Often high voltage electron multiplication is used to amplify the signal. However, this amplification introduces some statistical noise and the electronics necessary to accomplish the high voltage multiplication are costly. The electrical circuit disclosed in the present invention can reduce noise and costs in these and similar charge measurement applications.

In all measurement or sensing applications where the noise of the electronic measurement circuit limits the lower limit of sensitivity or affects the linearity or dynamic range of the sensor, the electronic circuit presented herein can improve the sensor's performance. Among types of noise are shot noise, Johnson and other thermal noise sources, bias currents, leakage currents and other charge conduction paths that interfere with accurately measuring or detecting the signal. It is also advantageous to use the circuit proposed here because of reduced cost, size, and/or power.

In U.S. Pat. Nos. 4,769,547, 4,804,847 and 4,970,391, certain circuits are described in relation to ion chamber construction. This patent application extends the teachings of those patents by disclosing circuit configurations and techniques which permit the invention's use in other applications which can benefit from increased detector sensitivity, linearity, dynamic range, lower cost, etc.

OBJECTS OF THE INVENTION

It is an object of the present invention to provide an electronic circuit which improves the performance of sensors which produce small currents, charges, or voltages by improving their lower limits of detection, dynamic range, frequency range, and/or linearity.

It is another object of the present invention to provide an electronic circuit which improves sensor performance by eliminating continuous direct current discharge paths for removal of the charge or current generated by the sensor.

It is another object of the present invention to provide an electronic circuit which improves sensor performance by minimizing inaccuracies caused by bias currents, leakage currents, current drawn from or input to the sensor, and/or other charge conduction paths that interfere with accurately measuring or detecting the signal.

It is another object of the present invention to provide an electronic circuit which improves sensor performance by minimizing inaccuracies caused by shot noise, Johnson noise, thermal noise, and other AC or DC noise sources.

It is another object of the present invention to provide an electronic circuit which improves sensor performance by minimizing inaccuracies caused by the dead time during which the charge measurement circuit is being discharged or restored.

It is another object of the present invention to provide an electronic circuit for measuring current or charge.

It is another object of the present invention to measure a low current or low voltage signal and provide a direct digital output.

It is another object of the present invention to reduce the power required to measure a low current or low voltage signal.

It is another object of the present invention to provide an electronic circuit for use with a variety of sensing media, including but not limited to high impedance sensing media, that produce a signal by either charge or current, production or induction in response to some physical phenomena occurring within the sensing media.

It is another object of the present invention to provide small, lightweight assembly which electronically records the phenomena being sensed.

It is an additional object of the present invention to provide an electronic circuit with a transistor and/or integrated (electronic) circuit design, manufacture, and handling process that optimizes the ability to operate with small currents, small amounts of charge and high impedance sensing mediums.

SUMMARY OF THE INVENTION

One embodiment of the present invention provides an electronic circuit for measuring current or charge that can be used with a variety of sensing media (including high impedance sensing media) that produce a signal by either charge or current production or induction in response to physical phenomena occurring within the sensing media. A current or charge sensing or collecting electrode is placed within the sensing medium to create a signal from the produced or induced current or charge that is electrically coupled to a control gate of an amplifying transistor which is either connected to or incorporated into an amplifier. The signal is created by establishing an electric field that moves charge of one polarity toward the sensing electrode. The electric field is established by setting a reference electrode at a different voltage potential (bias) than the sensing electrode. The control gate/sensing electrode, which is initially biased to a predetermined level, provides an output that changes with the amount of sensed charge to produce a signal at the amplifying transistor that is representative of the amount of charge collected. This signal is applied to an interface and passed to a sense amplifier so that when the signal passes a predetermined threshold, the counter is triggered and is incremented. Triggering the counter also commands a circuit element to clear or restore the predetermined bias level to the control gate (the sensing electrode) of the amplifying transistor. The control gate and interface are configured to have a very high impedance which creates some of the benefits of the invention. The counter circuitry provides a digital output representative of the physical phenomena.

In one embodiment, the voltage level (bias) of either the sensing or reference electrode can be switched relative to the other upon receipt of a triggering pulse. This changes the polarity of the electric field to cause charge of the opposite polarity to be driven to the sensing electrode, thereby eliminating the need to electrically connect a discharge path to the sensing electrode to clear the charge accumulated at the sensing electrode. This can be supplemented by capacitively coupling a compensation signal to the sensing electrode to cause the amplifier output signal to lessen in magnitude below a threshold level that permits additional charge or current measurements of the same polarity before performing bias reversal. These methods of clearing accumulated charge are a significant improvement over standard circuits which employ electrically noisy and expensive high value resistors to remove the charge accumulated on the sensing electrode, since elimination of this noise improves the performance of sensors which produce small currents by increasing their lower limits of detection, dynamic range and/or linearity.

Alternately or in combination with bias reversal and capacitive compensation, sensor performance can be improved by minimizing inaccuracies caused by leakage currents or current drawn from the sensor. The leakage currents are neutralized by the use of a controlled current source that induces current of a polarity opposite to the leakage current to flow to the sensing electrode. The controlled current source can be replaced or supplemented by a rate compensation circuit that compares the sensor output to the rate measured by an amplifier not connected to the sensing electrode, thereby providing an indication of the effect that the leakage current has on the sensor output to allow its correction. Other described methods of reducing leakage currents that can be used alone or in combination with the aforementioned features include the use of guard rings, physical switches or relays, the controlled creation of charges or currents of a specific polarity in a specific region of the sensing medium, controlled leakage over the surface of an insulator, and controlling the environment in which the circuit operates.

One preferred embodiment of the invention is described for use in an ionizing radiation detector which accurately measures both the total radiation exposure (with total charge reflecting the total dose) and the rate of exposure (with current reflecting the dose rate) using ionizable gas as the sensing medium. Alternate preferred embodiments of the invention permit use of the invention with sensing media other than ion chambers, including piezoelectric materials, photoelectric materials, liquid electrochemical materials, vacuum/gas/liquid/solid charge conduction materials, inductive pick-ups or coils, electric field measuring antennas, or even a surface with charge emission or work function changes. The electrical properties and/or size of many of these alternate sensing media do not require physically coupling the signal processing circuitry to the sensing device using an integrated circuit, thereby allowing use of discrete components to process the detected signal. However, where small size or low power is desired, and the number of devices to be produced is sufficient to justify the design and manufacturing costs, the circuit can be implemented on an integrated circuit. Approaches are described for manufacturing the invention to eliminate sources of leakage currents, including opening protective conductors after manufacture as needed.

The subject matter which is regarded as the invention is particularly pointed out and distinctly claimed in the concluding portion of the specification. The invention, however, together with further objects and advantages thereof, may best be understood by reference to the following description taken in conjunction with the accompanying drawings.

BRIEF DESCRIPTION OF THE DETAILED DRAWINGS

FIG. 1 illustrates a functional block diagram of the ionizing radiation detector of the preferred embodiment;

FIGS. 2, 3 and 4 schematically illustrate electric field configurations with multiple sensing electrodes;

FIG. 9 illustrates a block diagram circuit for measuring the amount of charge collected and counting the charge accumulated;

FIG. 10 illustrates a block diagram circuit that changes the rate at which the voltage changes on the sensing electrode dependent upon the charge accumulation count;

Figure 31A:
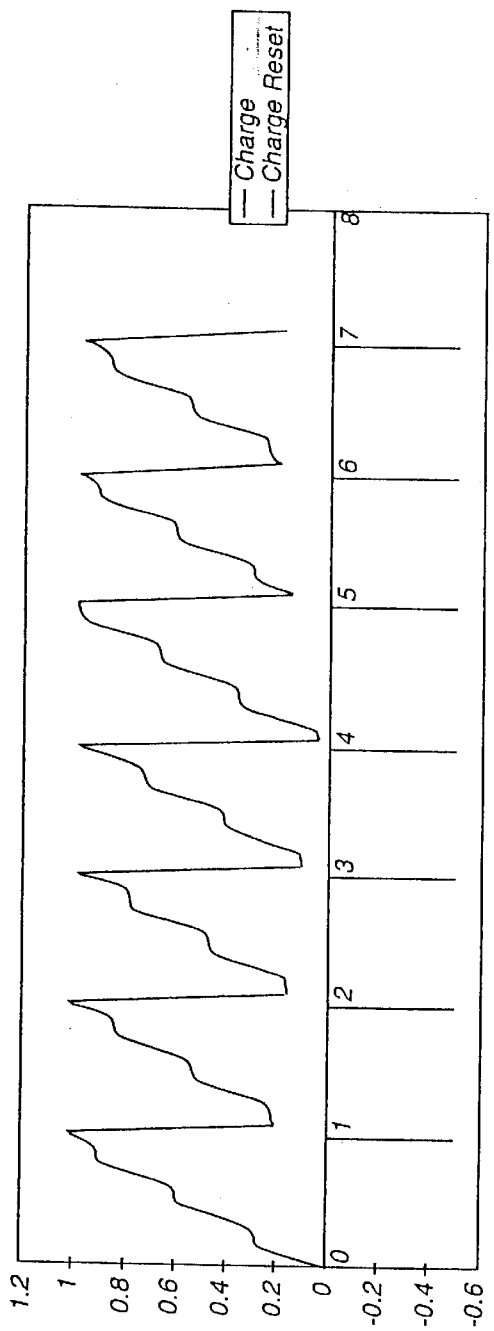
Figure 31B:
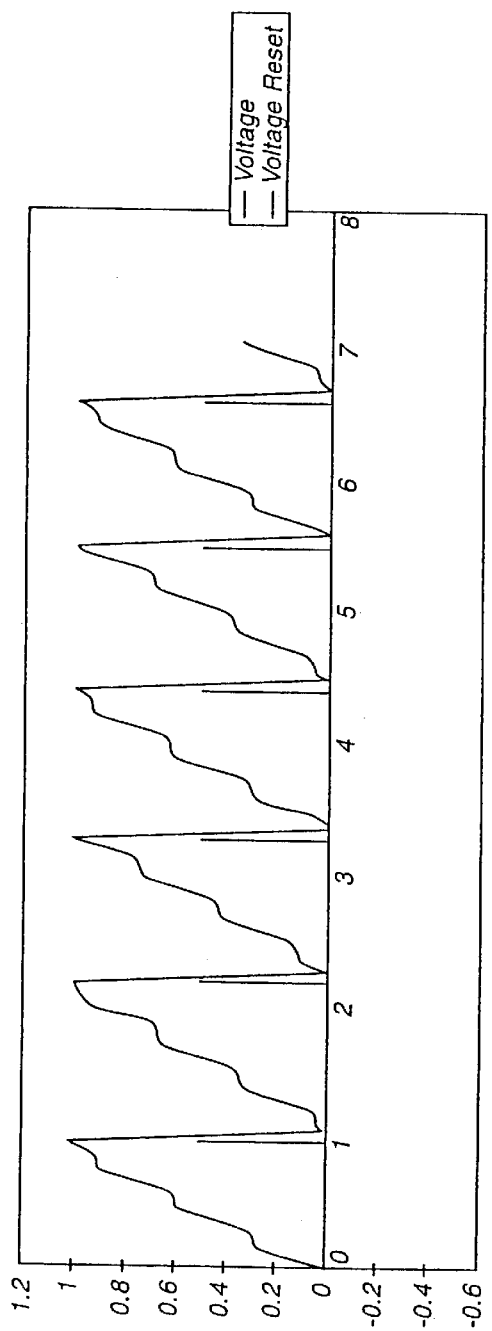
Figure 31C:
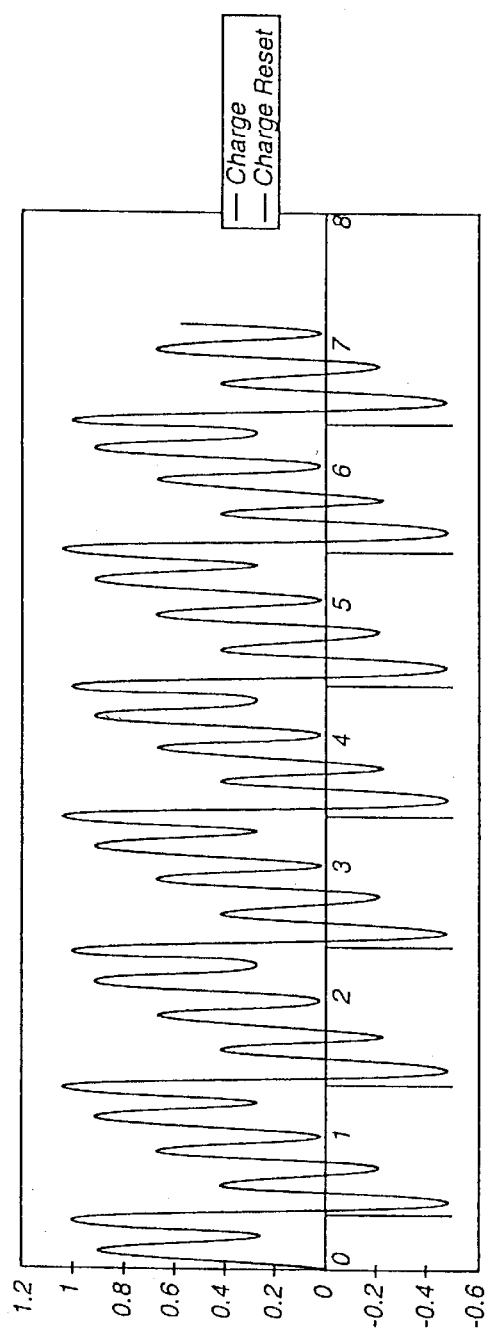
Figure 31D:
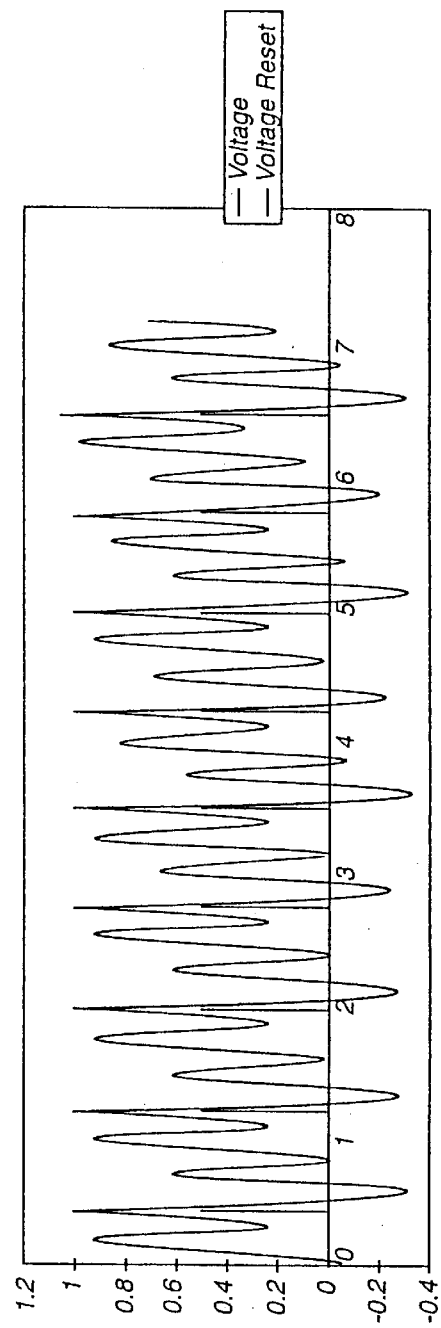
Figure 31E:
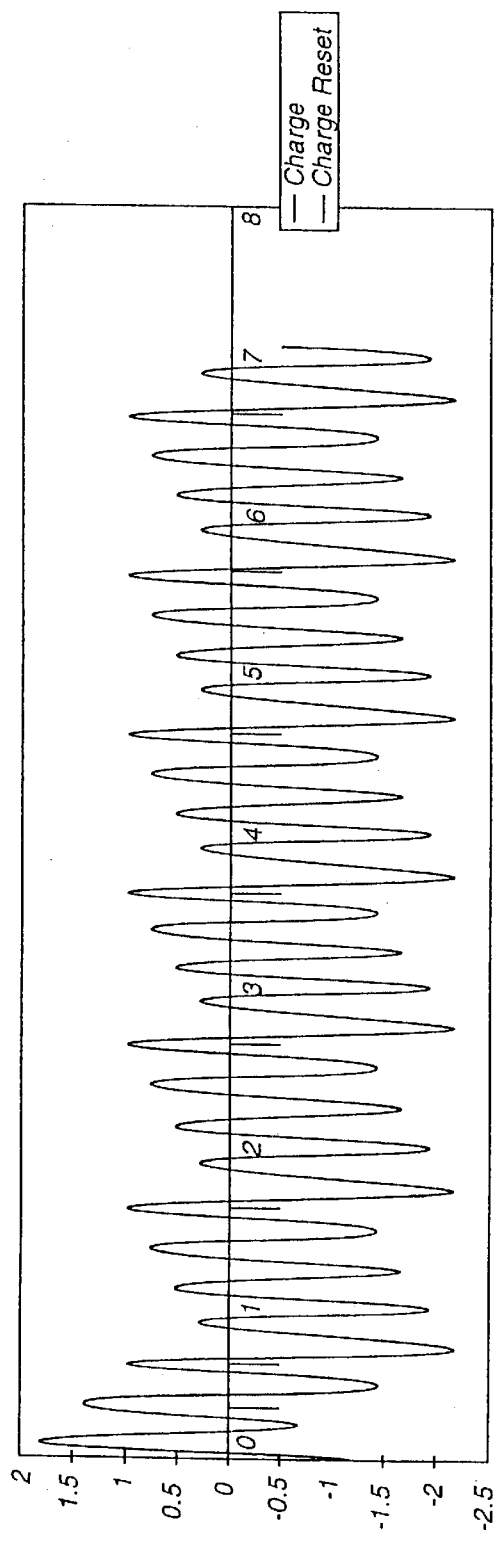
Figure 31F:
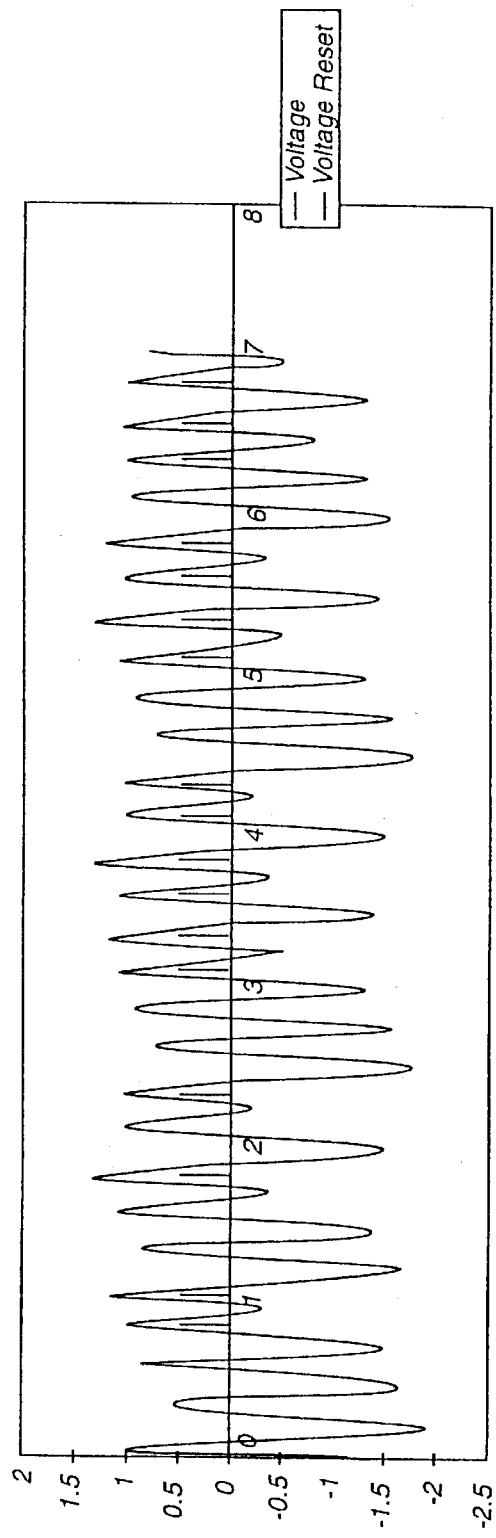

FIGS. 31a, 31c, and 31e show the effects for various amounts of noise using charge packet removal vs. FIGS. 31b, 31d, and 31f which show the effects of voltage restoration for resetting the circuit.

DETAILED DESCRIPTION OF THE PRESENTLY PREFERRED EMBODIMENTS

The following description incorporates the disclosures of U.S. Pat. Nos. 4,769,547; 4,804,847 and 4,970,391 by reference, as if fully set forth herein.

A sensing medium detects some characteristic of a physical phenomena to be measured. In the embodiment shown in FIGS. 1–10 of incorporated U.S. Pat. Nos. 4,769,547, 4,804, 847 and 4,970,391, the sensing medium is configured as a radiation detector to measure the radiation level and/or dose rate of ionizing radiation incident upon an ion chamber 16 located atop an integrated circuit (IC) having a collecting or sensing electrode 155 or 170 in direct contact with the gas. In other embodiments, a variety of sensing media (including high impedance sensing media) that produce a signal by either charge or current production or induction in response to some physical phenomena occurring within the sensing media can be used with the circuitry of the present invention. These sensing media include piezoelectric, photoelectric or liquid electrochemical materials, as well as gas/liquid/solid materials, in which mobile charge is created in response to some physical phenomenon of interest and then collected by an electric field applied to a sensing or collecting electrode. Alternately, in some sensing media non-mobile charge can be induced on or in the sensing electrode to create an electric field in response to a physical phenomenon of interest which can then be measured to indicate the magnitude of the phenomenon. In sensors which employ detection of a change in capacitance in response to the physical phenomenon of interest, the high impedance sensing material can be replaced by a high impedance spacing material, often gas or a vacuum. In this case charge is induced on the sensing electrode by the change in capacitance, for instance a capacitive or electret microphone or a pressure or displacement gauge. In the case where the charges are coming from another instrument, for instance a mass spectrometer or a photoemitter, the high impedance sensing medium can be replaced by some transport medium (or vacuum) with other components remaining the same, because there is still an electric field or momentum source which drives the charges to the sensing electrode.

One preferred embodiment (similar to that shown in FIGS. 1–10 of incorporated U.S. Pat. Nos. 4,769,547, 4,804, 847 and 4,970,391) is an ionizing radiation detector which accurately measures both the total radiation exposure (with total charge reflecting the total dose) and the rate of exposure (with current reflecting the dose rate) using ionizable gas as the sensing medium. The radiation detector includes a radiation detection assembly (that can be a plurality of detection subassemblies) and a detector control and interface unit. Each subassembly can include a hemispheric bubble of electrically conductive tissue or equivalent plastic which defines a volume of gas within the bubble. The gas is adapted to be ionized by radiation incident thereon. When the volume of gas is desired to be very small, an integrated circuit (herein IC) can be mounted below the volume of gas, with a collecting electrode, connected to the control gate of the amplifying transistor, placed on the surface of the IC in direct contact with the gas to collect ions (charged molecules or atoms) resulting from the ionization of the gas by the radiation. The IC includes an amplifier that incorporates the control gate, while the detector control and interface unit conditions and buffers the signal from the amplifier. The electronic circuit does not have to be implemented as an integrated circuit, however. The interface may additionally include a dose and dose rate computer, a memory and a communications section. In one embodiment, the unit includes a sensing amplifier similar to that used in DRAMs (dynamic random access memories) that acts as a comparator, and a counter which is used to control the detection subassembly. Multiple electrodes can be used, either physically discrete or on the surface of the IC, and configured either as collecting electrodes or biasing electrodes to permit electric fields of differing strengths to operate in different regions of the sensing medium to optimize performance. In the latter configuration, the flux lines of separate electric fields extend between biasing and collecting electrode pairs instead of a uniform electric field that extends between the collecting electrodes and the interior surface of the conductive plastic defining the bubble of gas. Another embodiment of the present invention utilizes several volumes of gas disposed above a single IC to account for measuring radiation at different dose rates. In this setting, the IC has a plurality of collecting electrodes each separately in direct contact with each volume of gas. In an additional embodiment, one volume of gas is displaced from atop the IC by a small distance to permit the IC and the corresponding collecting electrode in the offset volume of gas to be mounted on the substrate with the electrode electrically coupled to the amplifier in the IC.

Figure 1:
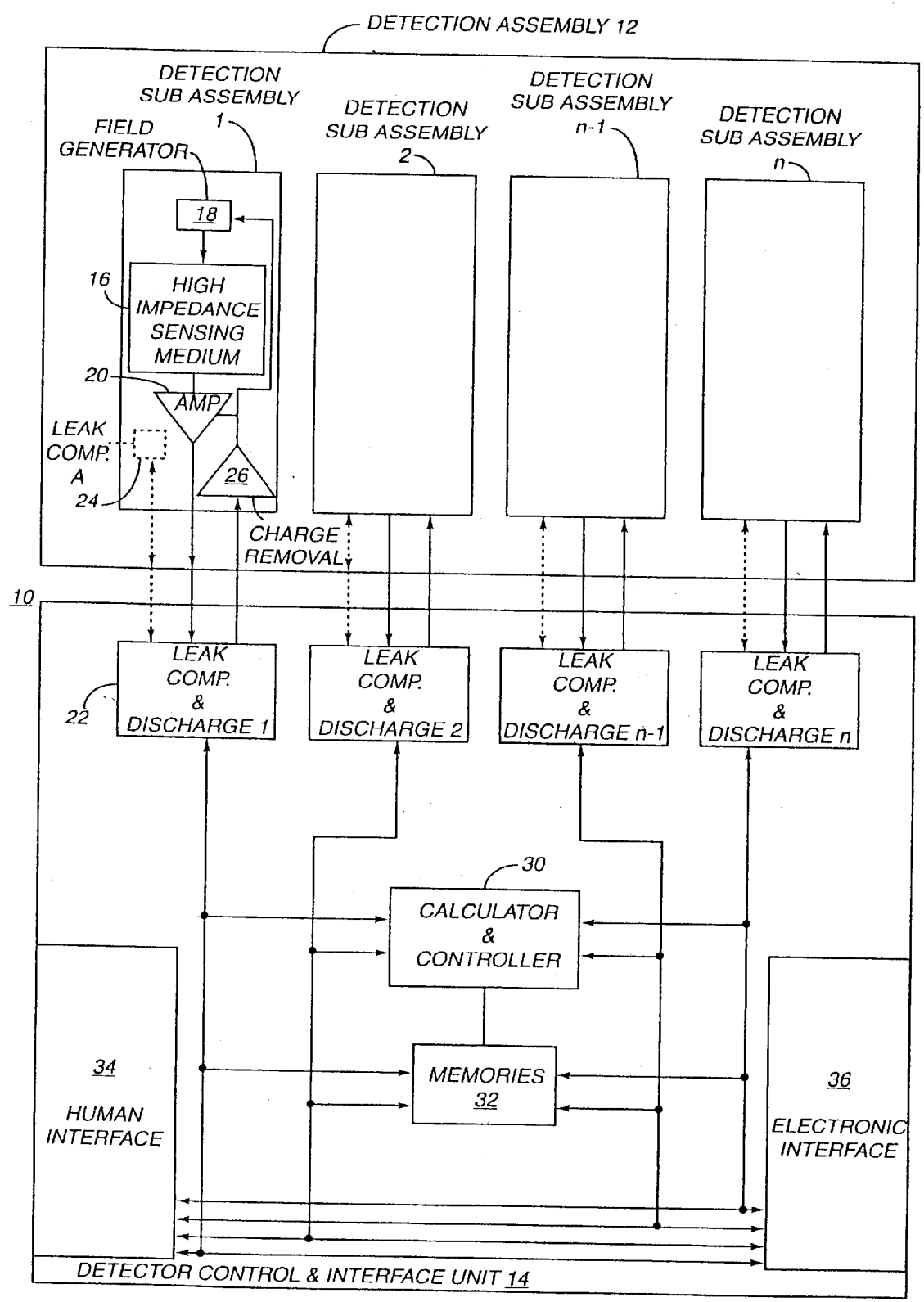

FIG. 1 illustrates a functional block diagram of one preferred embodiment of the present invention with detector 10 representing the general design features required for implementation of the circuitry of the present invention in any suitable application. Detector 10 includes two general sections, a detection assembly 12 and a detector control and interface unit 14. This distinction and the described separation of functions are made for clarity of explanation and are not functional requirements of the embodiments. Detection assembly 12 includes detection subassemblies 1, 2 . . . n–1, n. Each detection subassembly includes similar items as those depicted in detection subassembly 1. In the general case, the detection subassemblies can utilize similar or different sensing mediums, including high impedance sensing mediums, electrochemical cells, variable capacitors, or other charge generating mechanisms coupled to the electronic circuits to provide the desired information. For instance, this could include the presence of different gases or types of electromagnetic radiation. The multiple sub assemblies could also be chosen to operate over different ranges, so that the dynamic range of the whole device is greater than that of any one detection subassembly. Or, the different detection sub assemblies can be configured to respond to different variations of the physical phenomena of interest, such as detecting different gases in the air. Further, the different detection sub assemblies can be configured to respond to totally different physical phenomena, such as the presence of different gases in the air as well as temperature. This may be done to provide a complete set of information about the physical phenomena being detected or because there is some relationship between the different physical phenomena which must be taken into account, for instance if the sensitivity of one detection sub assembly depends upon a quantity measured by another detection sub assembly.

Referring again to the embodiment shown in FIG. 1, a field generator 18 develops an electrical field within the sensing medium to move the charges created by the physical phenomenon. For solid sensing mediums, the field generator 18 is connected to an electrode on the surface of the material, often called a bias electrode. The electric field drives the charges to be measured from the bias electrode to the collecting or sensing electrode. The signal from the sensing electrode is applied to amplifier 20 and is subsequently applied to a leakage compensation and discharge controller 22 in detector control and interface unit 14. Transistor diffusion induced leakage compensation is discussed in detail below with respect to FIGS. 9 through 12. Alternatively, or in addition to leakage compensation and discharge controller 22, the detection subassembly 1 may include leakage compensation circuit A 24. Since the sensing electrode attracts charges due to the bias placed thereon, the subassembly includes charge removal device 26 that is optionally coupled to the input of amplifier 20 and/or the input of field generator 18. The specific circuitry for charge removal device 26 and its operation is described later with respect to FIGS. 9 through 24. Leakage compensation and discharge circuit 22 controls charge removal device 26. In the detector control and interface unit 14, a leakage compensation and discharge circuit 22 is associated with each detection subassembly. Leakage compensation and discharge unit 22 is coupled to calculator and controller 30, memories 32, human interface 34 and electronic interface 36. The calculator and controller 30 generally calculates the effect of the physical phenomenon (or phenomena) being measured, such as determining the total amount of radiation an ionizing radiation detector has been subjected to as well as the rate at which the detector detects the radiation, which are then stored in the memories 32. The detector 10 may be embodied as CMOS integrated circuit elements to reduce power requirements and hence reduce the size of a power supply. The power can be internal to the detector and can be a battery; the power supply and the battery are not shown in FIG. 1.

Various detection subassemblies and associated circuits in the detector control can be embodied as a plurality of integrated circuits (ICs). These ICs can be coupled to a microcomputer on a chip that operates calculator and controller 30, memories 32, human interface 34 and electronic interface 36 that permits the detector to be connected to external monitors or an external computer network. In another embodiment, a substantial portion of the detector can be embodied as a single IC. In general, the human interface 34 can include a display which displays the total measurement (i.e., the dose, or the dose rate in an ionizing radiation detector) and can provide other hardware or software which makes other functions using the output of the detector available to the user such as displaying the desired measurement upon command. Alternatively, those values could be continuously displayed.

Further, the human interface 34 may include alarm circuitry which would audibly, visually or otherwise (such as tactile or olfactory) provide an alarm to a human indicating that a certain threshold has been exceeded or other conditions have occurred. Electronic interface 36, in another preferred embodiment, could include a communications section linking a plurality of detectors together. The electronic interface 36 or the human interface 34, in combination with calculator and controller 30 and memories 32 could provide for the setting or programming of an alarm. In the preferred embodiment, calculator and controller 30 is the controller for interfaces 34 and 36, memories 32, and the other components in unit 14. In other alternative embodiments, detection subassemblies 1, 2, n-1 and n could be constructed to sense different degrees of measurement (i.e., detection subassembly 1 could detect significantly lower levels than subassembly 2 and calculator and controller 30 can be programmed to select the output from subassembly 2 only after the output of subassembly 1 reaches a predetermined value). In a general sense, detector control and interface unit 14 buffers the signal from detection assembly 12 and conditions the output signal from those subassemblies as well as processes those output signals.

FIGS. 2–10 of incorporated U.S. Pat. Nos. 4,769,547, 4,804,847 and 4,970,391 illustrate selected aspects of the physical construction of a device designed to use the circuit of the present invention with a sensing medium suitable for detecting and measuring the effect of a physical phenomenon of interest. Although the discussion therein pertains to issues of concern in constructing a device capable of measuring ionizing radiation, it is illustrative of the general approach taken in implementing the circuitry in other applications of interest and thus is not limited solely to ion chamber applications. Additional details may be found by referring to FIGS. 2–10 and the associated text in incorporated U.S. Pat. Nos. 4,769,547, 4,804,847 and 4,970,391.

Figure 2:
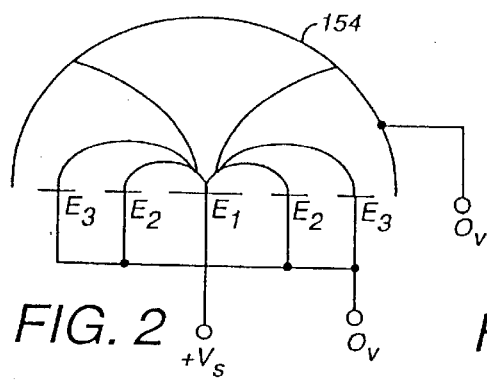
Figure 3:
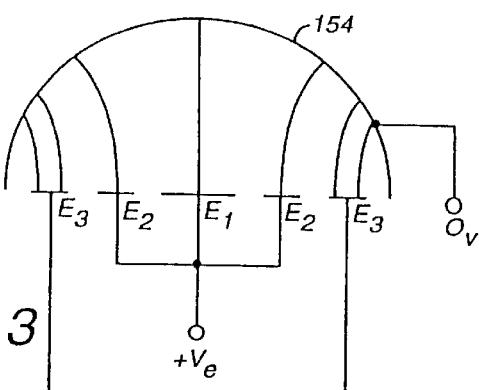
Figure 4:
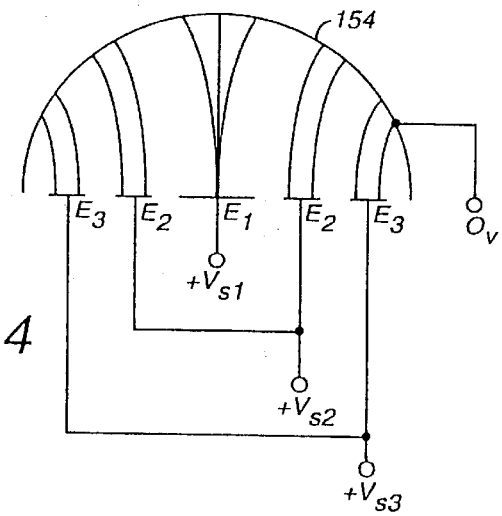

In order to efficiently collect charges within the sensing medium, an electric field is generated therein such that the charges move in response to the electric field. In FIGS. 2 through 4, flux lines are illustrated as intersecting with and/or extending from the electrodes. In general, by controlling the electric field, different regions of the gas volume can be swept or sensed by the electronics in the radiation detector. In the figures, the semicircular line 154 represents the interior surface of the border of the sensing medium. $V_s$ is the sensing voltage and usually designates the sensing electrode; 0V represents a grounded element; and $V_{s1}$, $V_{s2}$ and $V_{s3}$ represent different sensing electrodes set at different predetermined voltages. It is to be understood that the voltages illustrated and discussed herein are only exemplary and any discrete voltage levels can be used in place of the described and illustrated voltages. For example, rather than having a positive voltage at the sensing electrode, a negative voltage can be applied thereto. In that case, positive ions are sensed at the sensing electrode rather than negative ions as discussed with respect to a $+V_s$ at the sensing electrode. Also, the 0V could be any internal ground voltage other than zero volts which is designated as ground for the radiation detector.

In FIG. 2, electrode $E_1$ is the sensing electrode and is electrically biased to predetermined level $+V_s$. $V_s$ implies that this electrode is connected to a sensing circuit. The voltages $E_n$ imply connection to a voltage source with no measurement of collected charge being done. Electrodes $E_2$ and $E_3$ operate as biasing electrodes and are at 0V. The one end of the flux lines of the electric field in FIG. 2 intersects sensing electrode $E_1$ and the other end intersects biasing electrodes $E_2$ and $E_3$. Also, since interior surface 154 will be typically grounded and since the plastic is conductive in nature, the electric field does extend to that interior surface. In this situation, when charges are generated, negative charges will move along the flux lines towards sensing electrode $E_1$ due to the positive voltage level thereon and voltage $V_s$ will change, although the change may be minute, due to the accumulation of charge on electrode $E_1$. In order to obtain charge on sensing electrode $E_1$, the detection subassembly includes means for generating the electric field. The strength of the electric field generally depends upon the voltage differential between the sensing electrode and another element within or without the volume of gas. Therefore, the strength of the electric field can be varied by changing the voltage differential, at least in FIG. 2, between electrode $E_1$ and electrodes $E_2$ and $E_3$. By applying a more negative voltage to electrodes $E_2$ and $E_3$, the electric field would increase. Similarly, by raising the voltage $V_s$ on sensing electrode $E_1$, the electric field increases. In FIG. 3, interior surface 154 is grounded at 0V, electrodes $E_1$ and $E_2$ are biased to voltage $+V_e$ and electrode $E_3$ is selected as the sensing electrode and is biased to $+V_s$. Since electrode $E_3$ is selected as the sensing electrode, the region swept is that region between electrode $E_3$ and surface 154 and is limited to the radially outer sectors of the volume. A complex conically cylindrically symmetric region is therefore swept. In FIG. 4, any one of electrodes $E_1$, $E_2$ and $E_3$ can be the sensing electrode since $V_{s1}$ need not equal $V_{s2}$ or $V_{s3}$.

The means for generating the electric field need not be a battery. It can be two dissimilar materials which are physically and electrically connected at one point. For example, if the ends of a piece of copper and a piece of steel are joined, a voltage develops across the free ends of the copper and steel due to the work function difference between the different materials. This voltage differential may be sufficient to create the electric field in the sensing medium. Particularly, a gold plate or element and a carbon based plastic may be utilized to generate an electric field in this fashion due to the work function between gold and the carbon based plastic. Also, the biasing and/or collecting electrodes do not have to be physically exposed to or in contact with the sensing medium, because as will be described in relation to FIGS. 13 and 15, the bias field can be reversed so that coupling the collecting or sensing electrode to the medium through an insulating layer is sufficient.

In operation of the circuit with a radiation detector, the radiation interacts with gas in the ion chamber to generate ions which move in the electric field. Ions of one polarity are collected on the exposed sensing electrode and the charge signal therefrom is amplified. If the sensing electrode is biased to a positive voltage with respect to the other electrodes, negative ions will be attracted and the voltage $+V_s$ will decrease based upon the amount of collected ions. The number of charges generated is functionally related to the magnitude of the physical phenomenon being measured; in the case of ionizing radiation it is proportional to the integral of the dose received. The gas in the chambers should be under a slight pressure to provide some crush resistance when thin covers are used for the detection of beta particles. The choice of gas is determined by the energy response desired. Air, nitrogen, argon or tissue equivalent gas are possibilities. The use of air would result in the radiation being measured in Roentgens (R). Tissue equivalent gas measures radiation in rad (radiation absorbed dose) or Gy (gray unit which equals 100 rads). Other sensing mediums may be used for other physical phenomena beyond ionizing radiation.

Ideally, all the charges generated are collected; however, the sensing medium performance is usually not ideal. In the example of the radiation detector the greater the radiation dose rate, the greater the number of ions generated. However, for finite electric fields, the ions are not collected instantly, so the concentration of ions in the gas increases with increasing dose rate. This results in some of the positive ions recombining with negative ions. These ions cancel and are not collected by the electrodes. Thus, the charge collected is decreased by this recombination and the measurement is no longer proportional to the dose received. A similar phenomena can occur in solids, with a free electron and a hole recombining before they reach the appropriate electrodes.

Because of this constraint, in the case of a radiation detector the minimum size of the ion chamber is determined by the minimum dose rate to be reliably detected. The dose rate permissible in an unrestricted area, an area which is classified as unrestricted by government regulations, is 2 mR/hr. A reasonable charge sensitivity for an integrated circuit amplifier is 1000 electrons since engineering literature describes an amplifier that can sense 1 mV with an input capacity of $1 \times 10^{-14}$F. Using the definition of 1 mR as being the amount of radiation required to generate 2000 ion pairs/mm$^3$, a volume of 180 mm$^3$ would average one pulse every five seconds at a dose of 2 mR/hr. The shape of the ion chamber is controlled by the conflicting desires to have as high an electric field as possible and as low a capacitance as possible. The higher the electric field, the faster the ions move and higher the dose rate which can be accurately monitored. The lower the capacitance, the smaller the minimum charge and hence the smaller the dose which can be measured. A large area parallel plate arrangement could give the highest field, but also result in a high capacitance. Concentric spherical surfaces would give a lower capacitance, but in turn limit the size of the electric field which can be generated between them.

Different detector sub assemblies can accurately measure different magnitudes of the physical phenomena being measured. In the example of measuring ionizing radiation, in certain situations, monitoring needs to occur over a wide range of dose rates, such as a survey instrument, or an area monitor which must take measurements during an accident as well as normal times. Or, some information about the radiation dose as a function of energy may be needed so several ion chambers are needed. The high dose rate chamber would be significantly smaller and have a higher field than the low dose rate chamber. For the high dose rate chamber, the sensing electrode need not be directly attached to the integrated circuit. The added capacitance caused by the smaller distance between the bias and sensing electrodes and by the connecting wire can be tolerated because the ion chamber does not need to be sensitive to minuscule amounts of charge. On the other hand, a larger chamber will be required for small dose rates in order to increase the sensitivity of the detector by minimizing the capacitance. The control electronics in the detector control and interface unit 14 monitor the dose rate from each detection subassembly and use the chamber which is most accurate.

Alternatively, two or more electrodes in association with one physical volume can be used. By changing the voltages applied to these electrodes, the volume swept by the collecting field can be changed. Examples of these are illustrated in FIGS. 2 through 4. There are an unlimited number of electrode configurations with various advantages. FIG. 2 shows the bias applied when measuring a low dose rate. All charge is collected at center electrode $E_1$. Charge is collected from the total volume. FIG. 3 shows the bias conditions for which charge is measured in a smaller, high field, volume. In FIG. 4, the sensing electrode and hence the volume swept can be selected. This approach can be applied to many phenomena in addition to gas for an ionizing radiation detector. For example, it can also be used with surface 154 being a photoemitter and the space between the electrodes filled with a vacuum or an appropriate gas. Electrons emitted from different areas of surface 154 would be collected and measured by the electrode(s) designated as $V_s$. This would change the sensitivity of the measurement. Piezoelectric materials are another example of a sensing medium that can benefit from a similar multiple electrode structure. By using phase information from the different electrodes, it is possible to determine the direction of an input phenomenon such as a seismic or sound wave which is compressing the piezoelectric material. It is also possible have different materials on the different electrodes so that they respond differently. For example, they could be coated with different electrochemical materials that respond to different gasses. In this way multiple detection sub assemblies can be built in a small space.

The bias electrode 154, (156, 171, 182 in various other figures) may be a screen or a grid with a small hole or holes, and the charge to be measured passes through the screen. The bias field then drives the charges to the sensing electrode. The screen separates or shields the sensing electrode from other electric fields in the instrument. This is commonly used in vacuum instruments such as mass spectrometers, vacuum gauges, and in gaseous ion chambers. Thus the charge does not have to originate between the bias and sensing electrode.

Figure 5:
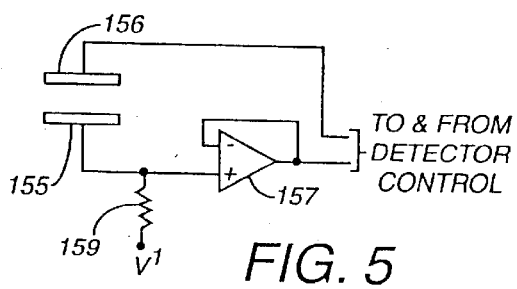
FIGS. 5 and 6 illustrate prior art circuits, in block diagram form, which measure the voltage of the sensing or collecting electrode using a high value discharge resistor.
Figure 6:
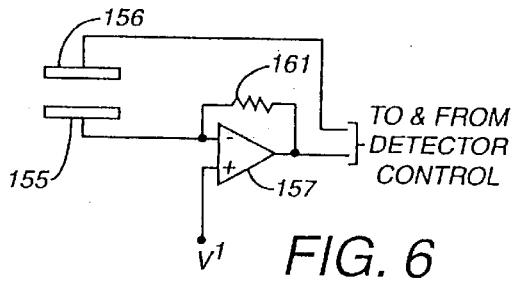

FIGS. 5 and 6 illustrate prior art circuits which measure the current to a collecting/sensing electrode 155 (also designated in other figures by reference numeral 170) rather than a signal caused by the collection of charges on that electrode. Sensing electrode 155 can be used with various sensing mediums or physical arrangements, such as gases, insulating liquids, piezoelectric materials, variable capacitors, or a vacuum. In FIG. 5, one input of amplifier 157 is biased to a voltage level dependent upon the power source $V^1$ and the value of resistor 159. The voltage changes due to the voltage drop across resistor 159 as the collected charges or current is conducted through it. (V=IR, so the change in voltage is the resistance times the change in current, dV=R*dI. Current, I, is dQ/dt, or the change in charge with respect to time. Among the significant limitations on this circuit's ability to measure small currents are Johnson noise in resistor 159 and bias current in amplifier 157. Amplifiers with bipolar or JFET transistor inputs, or with diodes for static protection require some bias current, otherwise their inputs drift. Also, high value resistors necessary for measuring small currents are expensive. As is discussed in detail later, bias (or reference) electrode 156 (also referenced in other figures by numerals 171 or 182) is a bias electrode that establishes the electric field in the sensing medium, or which provides a reference for measuring a self-induced (or self-biasing) electric field such as a piezoelectric detector, electrochemical sensor, photoelectric sensor or variable capacitor. Bias/reference electrode 156 can also be used to establish a zero bias such as in piezoelectric or certain electrochemical sensors. FIG. 6 is a variation on FIG. 5 where the resistor 161 provides a feedback voltage signal that is a basis for comparing the signal obtained from sensing electrode 155, but the above limitations apply. In situations where a voltage is to be measured, the resistor 159 is necessary to allow bias currents to flow to the input of the amplifier 157. If the resistor were not present, the bias currents would have to flow through the sensing medium and could introduce errors.

Figure 7:
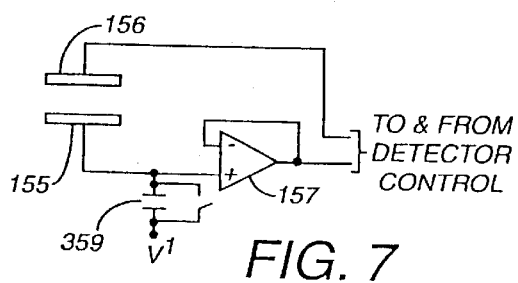
FIGS. 7 and 8 show prior art circuits which utilize capacitors to measure accumulated charge.
Figure 8:
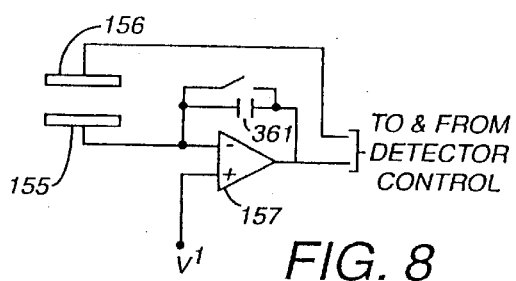

FIGS. 7 and 8 are analogous to FIGS. 5 and 6, except that capacitors 359 and 361 replace the high value resistors 159 and 161 respectively. While this eliminates the high value resistor and its associated limitations, it introduces some other limitations. The sensitivity is determined by V=Q/C, or dV=dQ/C for fixed capacitors, where C is the total capacitance of the sensing element to all other electrical conductors or insulators. Because capacitors build up or integrate charge, some means needs to be provided to remove it. This is commonly done via a transistor or physical switch which electrically connects the two leads of the capacitor so the charge can be neutralized. The difficulties with this circuit include leakage currents from the amplifier inputs, from the discharge transistor or switch, and leakage through the capacitor itself. Errors are also introduced because the input signal is not monitored during the time the capacitors are being discharged. These characteristics of the circuit limit the sensitivity, accuracy, or usefulness of these circuits when measuring small currents or charges. Circuits similar to those of FIGS. 5 through 8 can be found in the Burr Brown Op Amp book, pages 201–235.

FIGS. 9 through 28 illustrate in detail selected aspects of the circuit of the present invention. In FIG. 9, sensing/collecting electrode 170 is electrically biased to predetermined voltage level $V_s$. Bias/reference/counter electrode 171 is also set at a different or identical voltage, in this case by the power supply 173. The voltage difference between the two plus any work function difference establishes the electric field under which the measurement of charge or current at sensing/collecting electrode 170 takes place. The dashed box 175 indicates that those components are part of one detection subassembly shown in FIG. 1. The dashed box 177 indicates components considered part of detector control and interface unit 14 in FIG. 1. This distinction and separation of circuit functions are made for clarity of explanation and are not functional requirements of the embodiments.

The sensing electrode 170 is exposed to the sensing medium in which charges are generated by the physical phenomenon being measured. For example, in one preferred embodiment relating to an ion chamber radiation detector, the sensing electrode 170 is exposed to a volume of gas in which ions are generated by the incident radiation. As shown in FIG. 9, the sensing electrode 170 is also electrically coupled to the control gate 169 for amplifying transistor $T_0$, while the source of amplifying transistor $T_0$ is coupled to voltage $V_2$. $T_0$ is preferably a Metal Oxide Semiconductor Field Effect Transistor (MOSFET) which has an insulating layer between the gate and the semiconductor material. This means that there is essentially no current flow through the gate of the transistor at normal temperatures and conditions, unlike bipolar and junction field effect transistors. Any type of insulated gate transistor could be used. The drain of the amplifying transistor $T_0$ places a signal on line 172 representative of the amount of accumulated or induced charges on the control gate 169 and, hence, the magnitude of the physical phenomenon generating the charge; in one preferred embodiment, radiation sensed by the detector subassembly. Buffer amplifier 174 isolates amplifying transistor $T_0$ from the rest of the circuitry and amplifies $T_0$'s output, which is then applied to sense amplifier 176. In some circuits, buffer amplifier 174 may not be necessary. It is also possible to consider transistor $T_0$ to be part of buffer amplifier 174. Sense amplifier 176 determines when the $V_0$ passes a predetermined threshold $V_{ref}$ and generates trigger signal for counter 178. The trigger signal is also applied as a clearing control signal to a circuit which restores the sensing electrode 170 voltage to its original level $V_s$ by clearing the accumulated or induced charge from the electrode. If negative charges are accumulated or induced on sensing electrode 170, voltage $V_0$ will fall dependent upon the accumulated or induced charge; conversely, if positive charges are accumulated or induced on sensing electrode 170, voltage $V_0$ will rise dependent upon the accumulated or induced charge. When $V_0$ passes through threshold $V_{ref}$, sense amplifier 176 triggers counter 178 to increment the measurement.

Depending on the amount of accumulated or induced charge on the sensing electrode 170, switching transistor $T_1$ may be used to apply a clearing voltage $V_{c1}$ to the control gate 169 of amplifying transistor $T_0$. Clearing voltage $V_{c1}$ is developed across capacitor $C_1$. Switching transistor $T_1$ is turned on by the clear control signal (i.e., the trigger signal) from sense amp 176 and thereafter couples capacitor $C_1$ to the control gate of amplifying transistor $T_0$ to restore the voltage at sensing electrode 170 to its original level $V_s$ by charging or discharging capacitor $C_1$ to remove the accumulated or induced charge from the sensing electrode 170. During the trigger pulse, inverter 180 turns second switching transistor $T_2$ off and therefore isolates $V_{chg}$ from capacitor $C_1$. When the trigger signal is removed, second switching transistor $T_2$ is turned on and the voltage on capacitor $C_1$ is restored to its original level $V_{c1}$ when charged by voltage $V_{chg}$. It is recommended that transistors $T_1$ and $T_2$ do not conduct at the same time. In this sense, the turn off time of the transistor must be quick and the turn on time must be slow. Additional circuit elements may be added to ensure this occurs, but they are not shown because they are not essential in understanding how the circuit operates and would only complicate the explanation. This represents an improvement over prior art circuits such as FIGS. 7 and 8 because there is no "dead time" in which the capacitor is being reset. An alternative is to allow both transistors to conduct at one time. This causes the voltage of the sensing electrode to be reset to the voltage $V_{chg}$. This is not the preferred embodiment but may be used because it allows the elimination of C1 and a transistor and the associated circuitry to ensure the two transistors do not conduct at the same time. This is termed voltage reset or resetting of the sensing electrode, in comparison to the charge packet removal previously described.

This method of removing the accumulated or induced charge can be used when the voltage levels on sensing electrode 170 and bias/reference electrode 171 are either reversed or not reversed, depending on the sensing medium being monitored. For example, the voltage levels discussed with respect to FIG. 9 can be reversed. In that situation, positive ions or charges would be attracted to the sensing electrode 170 and amplifying transistor $T_0$ would either turn on at a certain voltage level $V_s$ or simply amplify the voltage $V_s$ based upon the accumulated charge. In that situation, voltage $V_0$ would steadily increase and sense amp 176 would provide a trigger when voltage $V_0$ exceeds reference voltage $V_{ref}$. Capacitor $C_1$ would then discharge the accumulated charge from the gate of transistor $T_0$ and capacitor $C_1$ would then discharge via transistor $T_2$ to the voltage source. Also, the buffer amp 174 and sense amp 176 could be inverting or non-inverting with compensation made elsewhere in the circuit.

The electronics has a maximum count rate set by its speed. If this maximum count rate becomes a limitation rather than the charge recombination rate discussed earlier, it is necessary to add an extra capacitance $C_R$ to increase the amount of charge removed with each cycle of $T_1$ and $T_2$. This is shown in FIG. 10. Transistor $T_R$ is controlled by rate change control signal TR GATE from control circuit 184. When rate change control signal TR GATE is high, capacitor $C_R$ is electrically coupled to capacitor $C_1$. Therefore, more accumulated charge on sensing electrode 170 is removed during each discharge cycle. For a constant dose, if the counter is incremented by a number greater than 1 for each trigger pulse from sense amp 176, the calibration in the counter per collected charge stays constant but the period between counter updates is increased. Therefore, the speed of the electronics is no longer a limiting factor. In this sense, the control circuit 184 would monitor the charge removal rate and provide rate change control signal TR GATE when the dose rate exceeds a predetermined level. Another alternative would be to have multiple charge removal circuits rather than just increasing the charge removed by the one circuit.

In one embodiment, transistors $T_0$, $T_1$ and $T_2$ as well as buffer amplifier 174, sense amplifier 176, counter 178 and capacitor $C_1$ can all be disposed within the integrated circuit. In applications such as piezoelectric or electrochemical mediums or large volume gaseous sensors, the increased capacitance of the medium eliminates the need to use an integrated circuit to minimize the capacitance of the circuit. In such cases, discrete components can be used for $T_0$, $T_1$, $T_2$, 174, 176, and 178 instead of integrated circuitry, decreasing the expense of manufacturing the circuitry in moderate production volumes. The partitioning of functions is purely a matter of choice by the designer, with an advantage of size, power, reduced cost in large production volumes, and capacitance reduction by including more on a single integrated circuit. In the case of an integrated circuit, buffer 174 and sense amplifier 176 may be combined. A sense amp similar to that used in dynamic random access memories may be used. Using a sense amp or comparator is a significant benefit over all prior art circuits of FIGS. 5–8 because there is no need for a linear amplifier. Linear or operational amplifiers tend to be more difficult and complicated to build, tend to draw more power, and suffer from non-linearities over the operating range which distort their response. The circuit being disclosed herein is able to benefit from the use of a comparator because when the comparator is triggered, the circuit operates to restore the charge on the sensing electrode towards a predetermined operating point or null condition. This will be discussed further in relation to FIG. 14. The circuits described in FIGS. 9 and 10 also have the benefit that the results of the measurement being made is available in digital form from the counter. No subsequent analog to digital conversion is needed.

Other data processing components in the detector control and interface unit are downstream of counter 178 and may or may not be on the same IC. Sensing electrode 170 is directly exposed to the sensing medium or the charge inducing physical arrangement and may be embodied as a bond pad or sense pad which is placed above a conductive channel or channels running internally in the integrated circuit. The sense pad may be larger than the internal conductive channel because the sense pad can be spread over a top layer of insulation on the surface of the integrated circuit. The precise construction of an integrated circuit having these electrical components is known to persons of ordinary skill in the art. CMOS technology can be utilized to obtain low power operation described herein. In embodiments using discrete components, sensing electrode 170 can be physically separated from but electrically coupled to the control gate 169 of $T_0$, but still designed to operate in a manner similar to that described above for FIG. 9. Although these components can be constructed as a single IC, their function corresponds to the functional block diagram in FIG. 1 as follows: sense amp 176 is part of amplifier 20; counter 178 corresponds to part of calculator and controller 30, and in this instance, transistor $T_1$ and $T_2$ and associated circuitry correspond to charge removal device 26. Counter 178 can be reset or re-zeroed on a periodic clock signal from circuit 30. Alternatively, the device control and interface unit could operate on purely analog or a mix of analog and digital signals from the subassemblies rather than digital signals.

The use of switching transistor $T_1$ to provide a discharge voltage $V_{c1}$ to the control gate of amplifying transistor $T_0$ presents a problem regarding the current leakage, $I_{leak}$, from the transistor diffusion region to the transistor or IC substrate. For those applications where the sensing medium or physical arrangement does not remove the charge when the physical phenomena returns to its initial state, the major difficulty with clearing or restoring voltage $V_s$ to the control gate 169 of transistor $T_0$ via transistor $T_1$ is the current leakage $I_{leak}$ from the transistor substrate to the drain/source of transistor $T_1$ and hence to the control gate 169 and sensing electrode 170. The current leakage is designated by dashed lines as $I_{leak}$ in FIG. 9 from the integrated circuit substrate to the drain (or source) of switching transistor $T_1$. This current leakage $I_{leak}$ will be sensed as an accumulated charge and for the example of a radiation detector, as a dose of ionizing radiation. A rough calculation indicates that this leakage could cause a pulse every eight seconds. For example, using a 0.18 cm³ chamber, this gives a background reading of radiation of 1.25 mR/hr which is unacceptable. The effect of leakage should be less that 1 mR/day. One method of compensating for $I_{leak}$ is simple pulse stream manipulation where the detector will not register any pulses unless the pulses are less than eight seconds apart. A second simple method is to have the radiation detector not register any dose when it is disabled or turned-off by storing the detector in a charging/disabling cradle during the time that it is not in use. $I_{leak}$ is one of the many types of leakage current discussed in this patent. For other sensing media or physical phenomena, $I_{leak}$ similarly limits the lower limits of detectability, causes the sensor or sensing medium to be bigger than it would otherwise be, causes non-linearity, or causes significant complication in amplifying the signal. Corrective measures for minimizing the effect of $I^{leak}$ are discussed below. These corrective measures can be used singly or in combination with each other.

Figure 11:
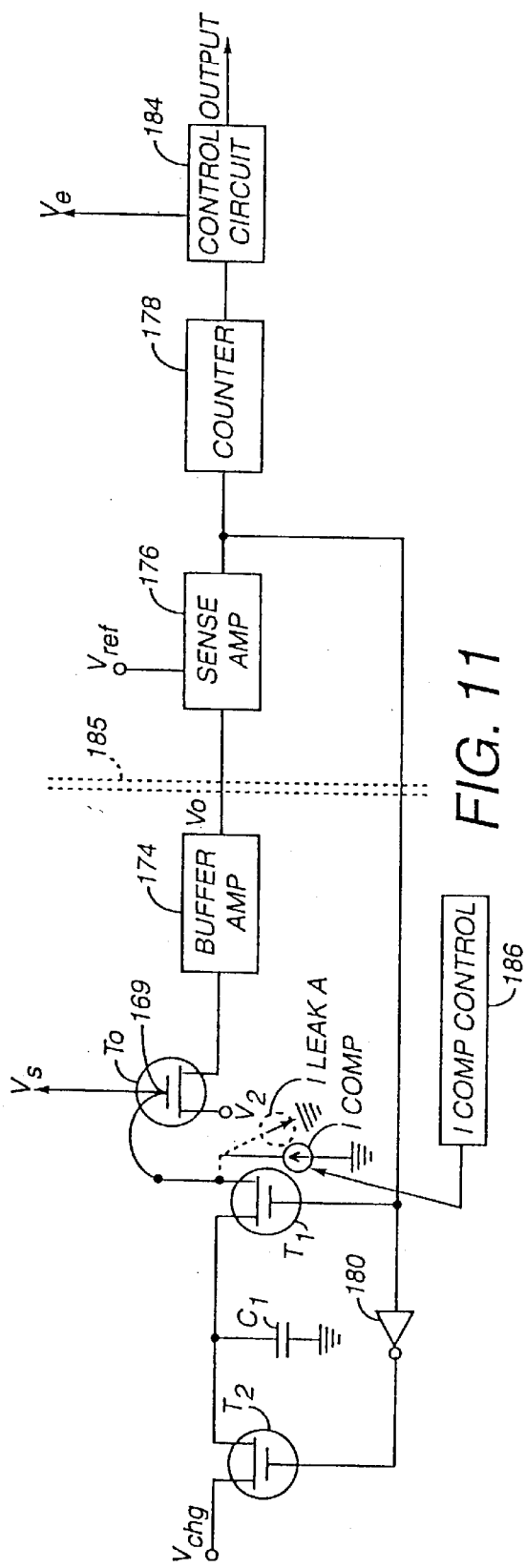
FIG. 11 illustrates a block diagram circuit for compensating current leakage between the drain of switching transistor T1 and the IC substrate.

FIG. 11 illustrates an example block diagram circuit for analog current subtraction known as a "charge pump" used to compensate for the leakage current. Current generator $I_{comp}$ is controlled by $I_{comp}$ control 186. The $I_{comp}$ control would be sent during calibration of the detector. If the voltages were reversed in FIG. 11, $I_{leak}$ would be a current source and $I_{comp}$ would be a current sink. Other conventional circuit configurations of similar design can also be used for this purpose. In either situation, $I_{comp}$ is controllable by $I_{comp}$ control 186. The difficulty with this system is having $I_{comp}$ follow $I_{leak}$ as conditions such as temperature vary. The circuit to supply $I_{comp}$ could be as simple as a duplicate discharge circuit triggered periodically by $I_{comp}$ controller.

Figure 12:
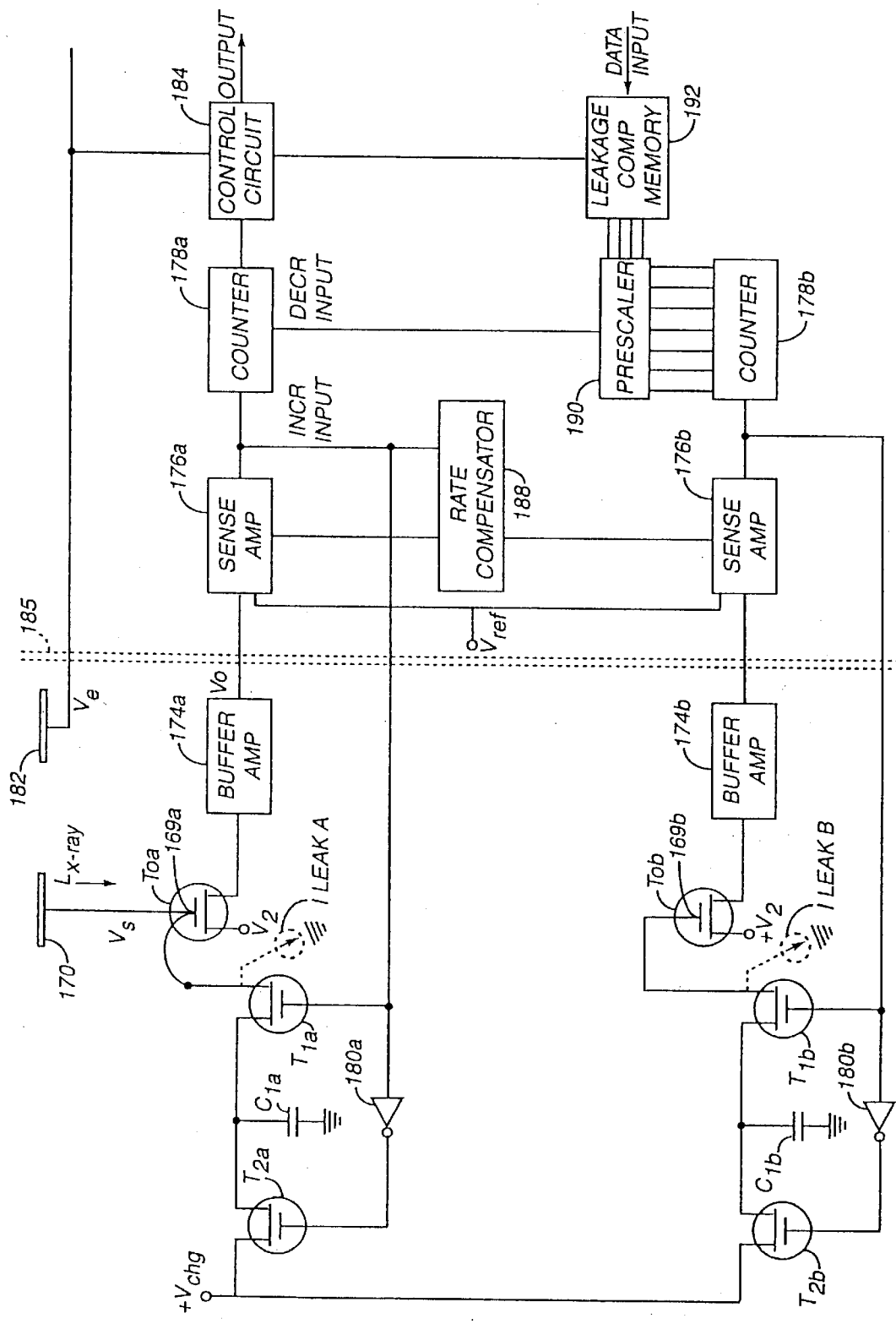
FIG. 12 illustrates further leakage compensation circuit.

FIG. 12 illustrates another alternative embodiment of a circuit to compensate for $I_{leak}$. In FIG. 12, the sensing circuit is indicated by character "a" such that transistor $T_0$ is now $T_{0a}$. $T_{0a}$ is coupled to buffer amplifier 174a, sense amp 176a and counter 178a. A duplicate circuit is illustrated with character "b". Therefore, the counterpart to transistor $T_{0a}$ is $T_{0b}$, buffer amp 174a is duplicated as amp 174b, etc. The primary distinction between the duplicate circuit and the sensing circuit is that the control gate 169b for transistor $T_{0b}$ is not coupled to a sensing electrode in the duplicate circuit. As long as $T_{1a}$ and $T_{1b}$ are equal in size and do not contain any gross defects, the leakages $I_{leak(a)}$ and $I_{leak(b)}$ should be almost identical. In other words, both leakage currents should track each other as conditions such as temperature vary. Therefore, the true signal can be determined by taking the difference between the number of pulses received by circuits a and b.

One example of a compensation method utilizes a rate compensator 188. It senses when the pulse rate in sense amp 176a is less than the pulse rate in sense amp 176b and prevents an increment in counter 178a. Thus, no dose is registered unless it is in excess of $I_{leak(b)}$. A second method is better adapted to proportional but unequal $I_{leak}(a)$ and $I^{leak(b)}$. A prescaler 190 decrements counter 178a when the count value from duplicate counter 178b equals the compensation count value in leakage compensation memory 192. The scaling circuit compensates for the measurement circuits not being identical. The leakage compensation memory is loaded during calibration and contains the proportionality constant related to the two circuits leakages. Another method to reduce current leakage $I_{leak}$ is the well isolation inherent in CMOS process. By keeping the well of transistor $T_1$ equal to the voltage of the sensing electrode 170, significantly less leakage will occur.

Figure 13:
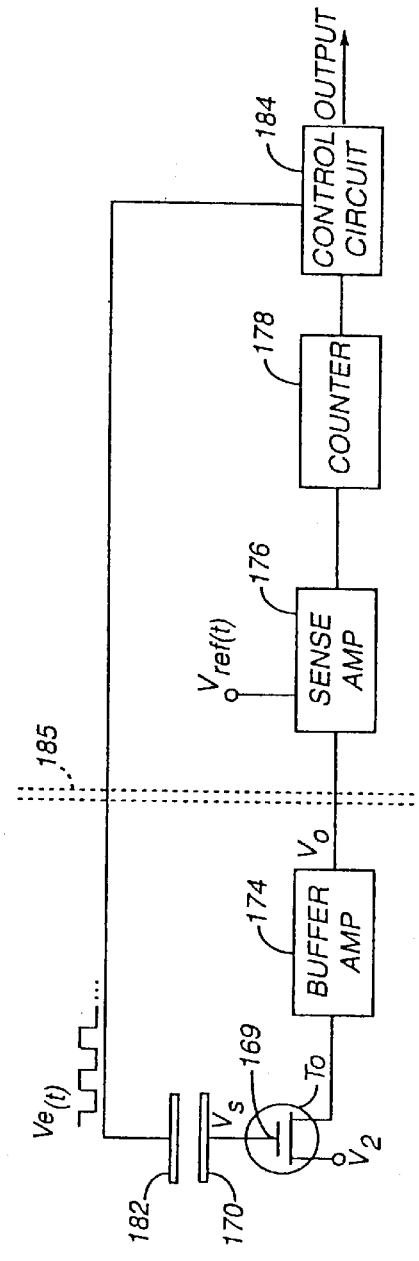
FIG. 13 illustrates a block diagram circuit that varies the voltage bias applied to the bias electrode thereby eliminating the switching transistor.

The best way to reduce leakage current $I_{leak}$ is to eliminate the discharge transistor $T_1$. As mentioned above, some physical phenomena such as piezoelectric material, induced electric field measurement, and changing capacitance restore the charge to its initial value when the phenomena is restored to its initial condition. For those phenomena that transport charge primarily of one polarity to the sensing electrode, the polarity depends upon the polarity of the field between the bias and the sensing electrode, FIG. 13 illustrates a further circuit, in block diagram form utilizing "bias reversal" for eliminating switching transistor $T_1$ and thus the source of leakage. The sensing electrode 170 is only connected to the control gate 169 of transistor $T_0$. The bias $V_{e(t)}$ drives a charge of one polarity to the sensing electrode 170. The single polarity charge accumulates at sensing electrode 170 until sense amplifier 176 triggers counter 178. Control circuit 184 changes the bias signal applied to bias electrode 182 thereby switching the electric field to bring charges of the opposite polarity to sensing electrode 170. The oppositely charged charges cancel the previously accumulated charge on sensing electrode 170. In this situation, the minimum voltage $V_{e(t)min}$ is less than $V_s$ which in turn is less than the maximum voltage $V_{e(t)max}$. The reference voltage $V_{ref(t)}$ is varied such that the sense amp 176 triggers the counter when signal $V_0$ exceeds a maximum threshold level in the instance of accumulated or induced positive charge at sensing electrode 170 and falls below a minimum threshold level in the instance of accumulated or induced negative charge at sensing electrode 170. Therefore, either the reference voltage $V_{ref(t)}$ must be switched within sense amp 176 or electrical circuitry be designed to determine when $V_0$ passes beyond a predetermined window. Depending upon the relative capacitances it may be necessary to have additional circuit components to compensate for the charge induced on the sensing electrode 170 by the change in voltage of the bias electrode 182. Again, this circuit has the benefit that the measurement is available as a digital number, the value in the counter. A modification not shown replaces sense amp 176 and counter 178 with a circuit that effectively converts the analog output of buffer amp 174 into a digital number. This reduces the frequency at which the voltage of the bias electrode 182 has to be changed. Depending upon the phenomena involved, the transit time for charges to move from the bias electrode 182 to the sensing electrode 170 may be greater than the period between the polarity reversals. If this is the case, the number of counts for a given amount of induced charge is greater than if the transit time were much faster than the switching period. This amplification may be a benefit, or it may cause a problem because the magnitude of the amplification effect is related to the number of charges in the gap between the electrodes and thus is non-linear. Also, the charges moving back and forth have a tendency to recombine at a greater rate. In spite of these effects, it could be possible to use this amplification effect to increase the sensitivity of measuring the phenomena of interest.

Figure 14A:
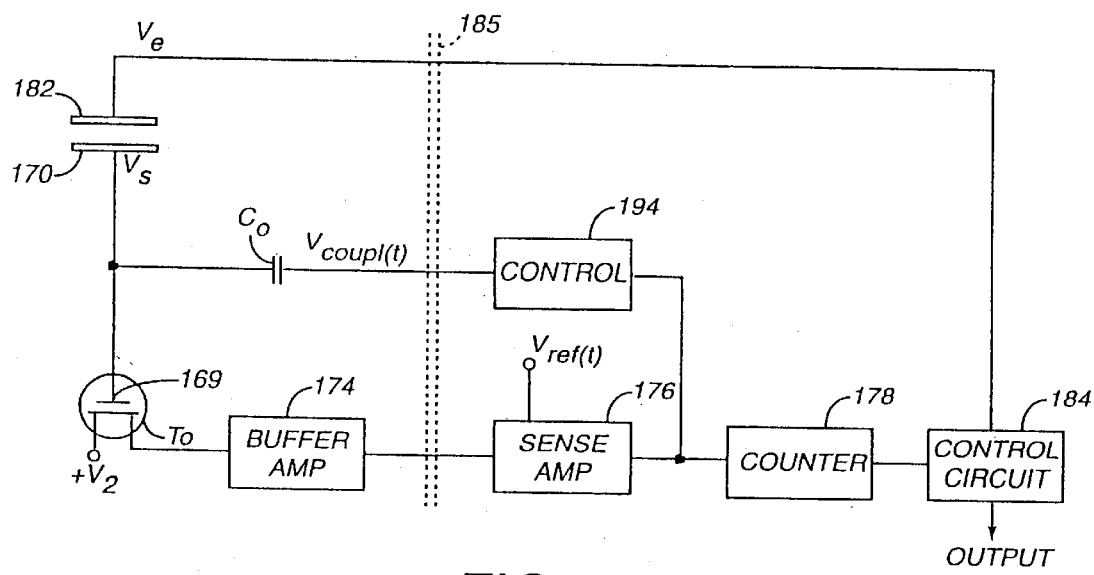
FIGS. 14A and 14B illustrate a block diagram circuit that changes the voltage level applied to the sensing electrode and the timing diagram therefor, respectively.
Figure 14B:
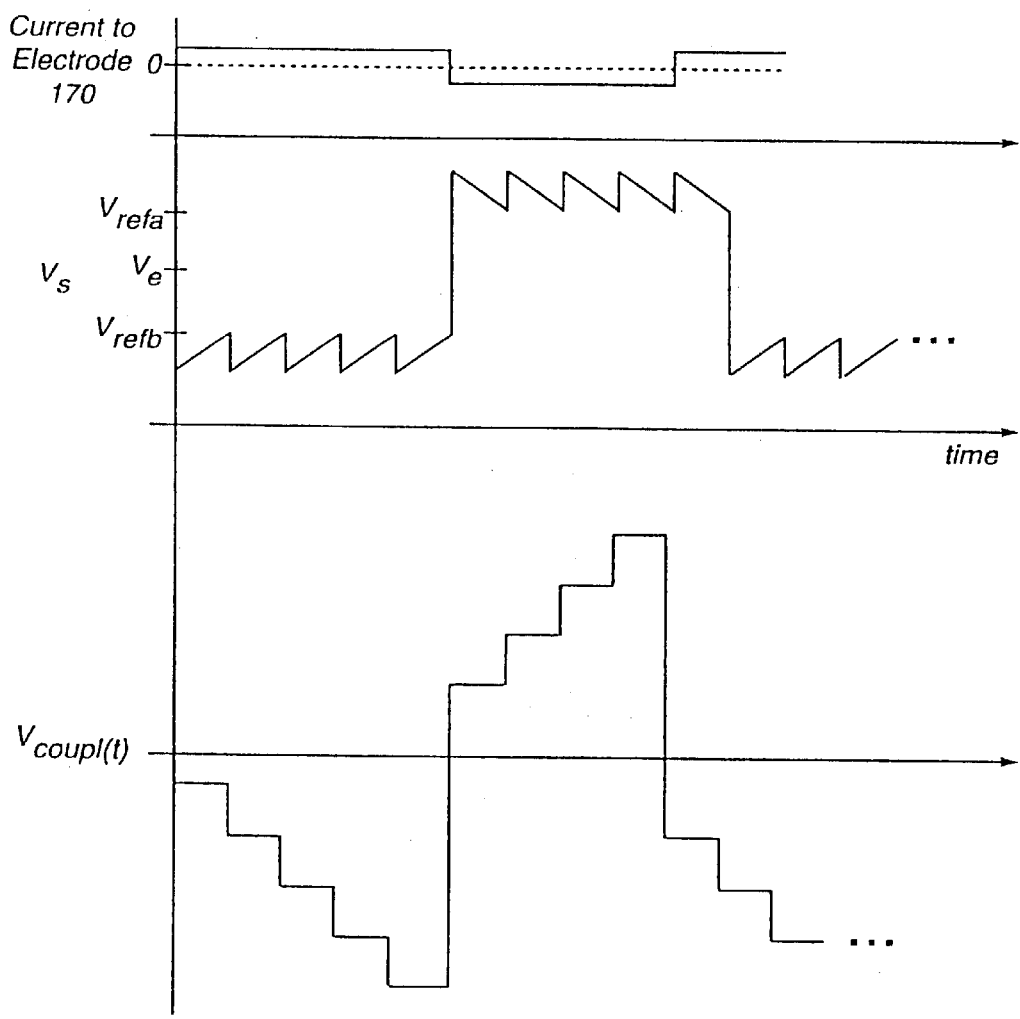
Figure 24:
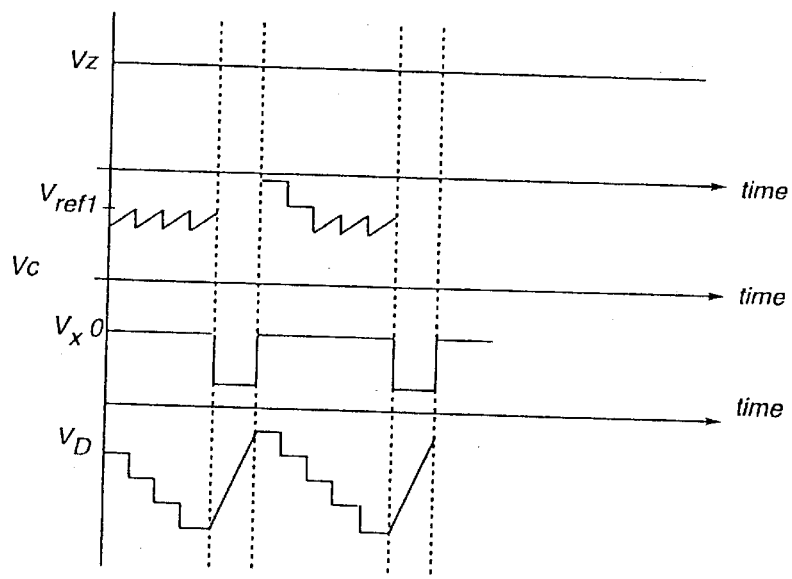
FIG. 24 is the timing diagram for FIG. 23.

FIG. 14A illustrates a block diagram for a "compensation capacitor" circuit which changes the voltage of sensing electrode 170 via a coupling capacitor $C_0$. In this embodiment, when sense amp 176 triggers counter 178 when $V_{coupl(t)}$ is at one level (see FIG. 14B), control circuit 194 switches coupling voltage $V_{coupl(t)}$ to a different predetermined level. This compensates for some of the charge that has been collected or induced on the sensing electrode 170. Therefore, the voltage $V_s$ is biased to a high and then a low predetermined level based upon a level control signal applied to level control circuit 194. In this situation, the biasing voltage $V_e$ applied to biasing electrode 182 is at an intermediate level as compared to the maximum coupling voltage $V_{coupl(t)max}$ and the minimum coupling voltage $V_{coupl(t)min}$. There is an additional complication that the sense amp 176 must now sense two voltages so some type of Schmidt trigger, window comparator, dual sense amplifier, or other means of measuring the voltage must be utilized with sense amp 176. As described earlier with respect to the dual bias levels, the reference voltage $V_{ref(t)}$ varies between two threshold levels dependent upon the coupling voltage $V_{coupl(t)}$. Switching via the coupling compensation capacitors is advantageous because it increases the time between switching of the bias voltage, it can increase the sensitivity of the circuit by compensation for small amounts of charge, and the coupling capacitor $C_0$ can be part of the integrated circuit. Another significant benefit of the compensating capacitor is that the sensing electrode 170 is maintained at a near constant voltage. This means that the voltage or field across the sensing medium is also kept constant, minimizing sensitivity changes that changing bias fields can cause. It enables the use of comparator or sense amp circuits rather than linear amplifiers. As will be discussed later, this also helps reduce induction or motion of charges over the surfaces of insulators. Also, the circuit in FIG. 14 has the benefit that the output is available as a digital number. As shown in FIG. 14B, the comparator operates at two points, $V_{refa}$ and $V_{refb}$. As mentioned above this has the benefit that the circuit does not need to operate linearly over a wide voltage range, and prior art circuits often try to do. These two voltages could be the same, and then there would be only one operating point, as shown in FIG. 24. Or, it might be possible to have more than two operating points, where other operating points would indicate that the circuit had moved outside of its normal operating range and some other action was needed, such as activating transistor $T_R$ of FIG. 10. In another preferred embodiment, the compensating capacitor is driven by an analog voltage from a linear amplifier circuit, for instance buffer 174 with significant gain, or from a successive-approximation circuit to maintain the sensing electrode 170 as close as possible to a constant voltage. This analog voltage or successive approximation number is then representative of the input signal.

Figure 15:
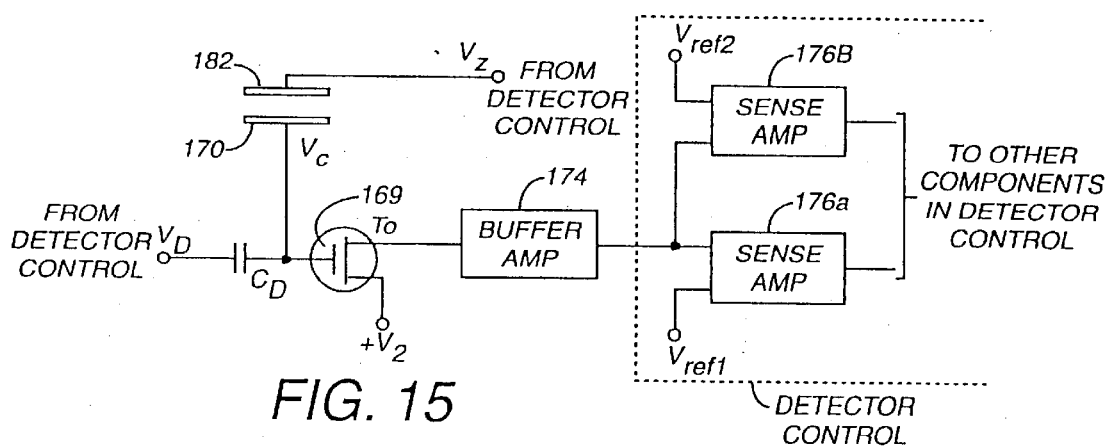
FIG. 15 illustrates a block diagram circuit that changes both voltage levels applied to the bias electrode and the sensing electrode.
Figure 16:
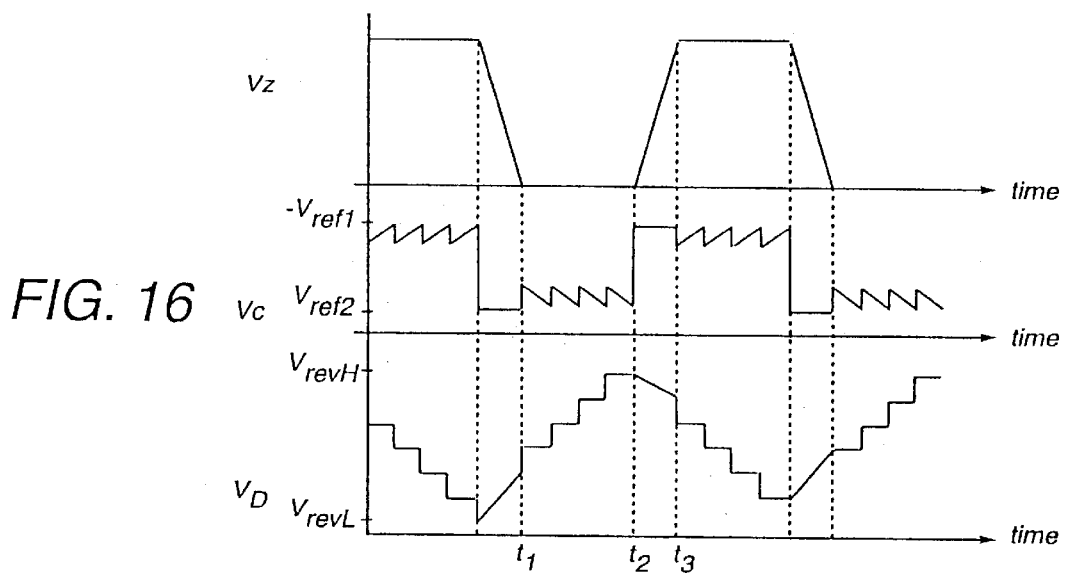
FIG. 16 shows a timing diagram for the circuit in FIG. 15.

FIG. 15 shows a block diagram of another circuit utilizing "bias reversal" in combination with a "compensating capacitor" for clearing the accumulated charge on the sensing electrode. FIG. 16 shows the timing diagram for the operation of the circuit in FIG. 15. Generally, the polarity of the electric field between the bias electrode and the sensing electrode is reversed periodically (see $V_z$ in FIG. 16) similar to the operation described in FIG. 13, i.e., when $V_D$ reaches $V_{revL}$ or $V_{revH}$ or effectively after a certain number of counts. Sense amplifiers 176a and 176b trigger a counter or other detector control component when the signal exceeds or falls below one of two reference voltages $V_{ref1}$ or $V_{ref2}$. However, with the addition of compensating capacitor $C_D$, the frequency at which field reversal is required is greatly reduced, if each time the threshold is exceeded, the voltage $V_D$ is changed in a stepwise manner to reset the voltage $V_c$ to a value which can again be compared with threshold $V_{ref1}$ or $V_{ref2}$ to trigger sense amplifier 176a or 176b another time. The relatively small voltage step restores the voltage of the amplifier input to its original value (see $V_C$ between times $t_1$ and $t_2$) and prepares the amplifier to sense another increment of charge. A change in $V_D$ indicates one pulse sensed by one of the sense amps. From times $t_1$ to $t_2$, these pulses represent charge sensed and thus measurement received. From times $t_2$ to $t_3$, the pulses are simply a result of the changing $V_z$ being capacitively coupled to $V_c$. When the compensating capacitor $C_D$ reaches the limit of its range at a minimum or maximum voltage level (i.e. when $V_D$ reaches $V_{revL}$ or $V_{revH}$), bias reversal is accomplished by switching $V_z$ to the opposite polarity with respect to the collecting electrode which then allows the capacitor to be charged or discharged in the opposite direction. With the use of bias reversal in combination with a compensating capacitor, the frequency at which field reversal is required can be greatly reduced, greatly extending the capacity of the circuit to handle high measurement rates along with substantially minimizing inaccuracies from charges having to change directions when the field polarity is changed. Also, it confers some noise resistance similar to that given by constant charge removal versus constant voltage reset. Finally it reduces the dead time that prior art circuits shown in FIGS. 7 and 8 experience. If the circuit is calibrated, the change in level from $t_2$ to $t_3$ can be known, and there is no dead time. If the designer chooses to not calibrate the circuit, then there will be some minimal dead time with the resulting loss in signal. This ability to reduce or eliminate dead time applies to all subsequent circuits which are modifications of FIG. 15. For simplicity, $V_{revL}$ or $V_{revH}$ may be the same voltage, although they are shown as being different voltage in FIG. 16.

Figure 17:
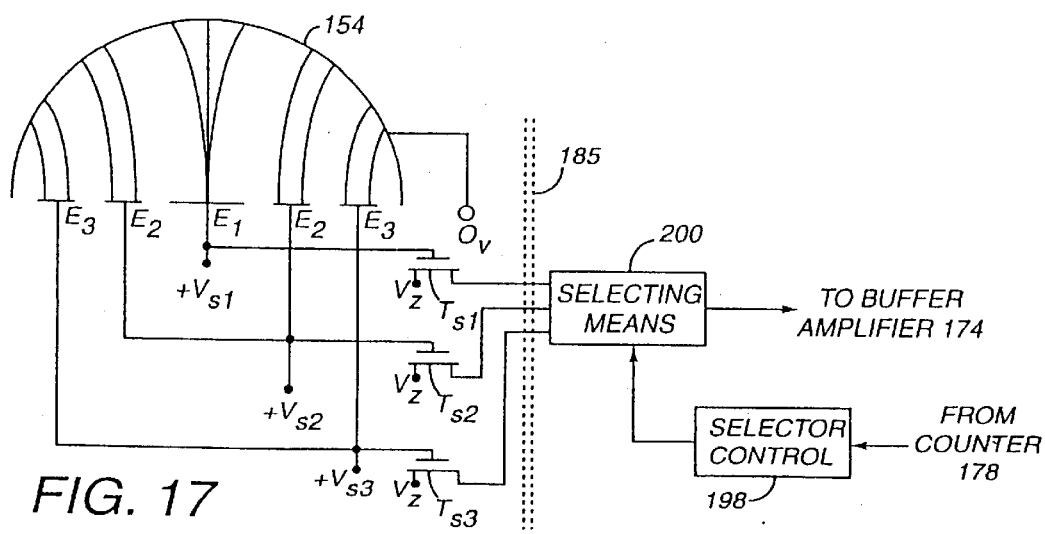
FIG. 17 illustrates multiple electrodes coupled to a selecting means in block diagram form.

FIG. 17 shows the multielectrode arrangement of FIGS. 2, 3, & 4 with sensing transistors connected to each electrode. While not specifically shown, any of the previously disclosed or subsequently disclosed charge removal strategies would be applicable. As discussed in reference to FIG. 1, different electrodes can be selected to help ensure accurate measurement over a wider range of physical phenomena.

Figure 18:
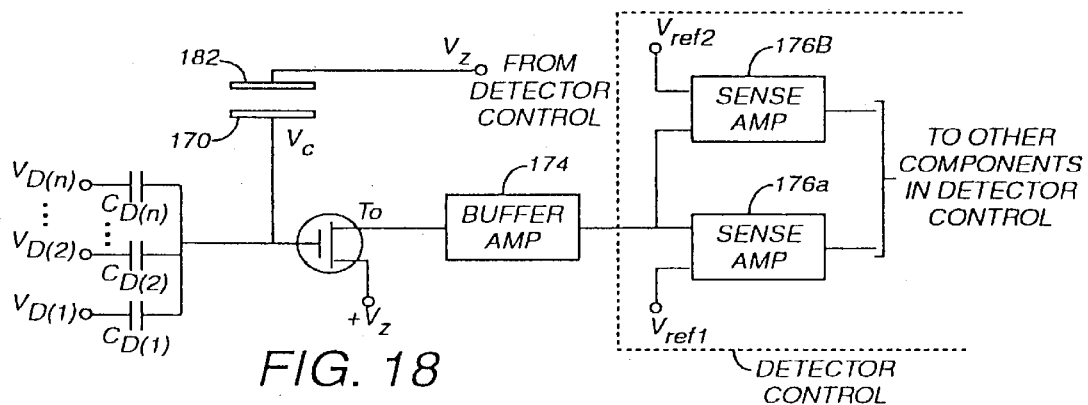
FIG. 18 illustrates a modification of the circuit in FIG. 15 where multiple compensation capacitors are used.
Figure 19:
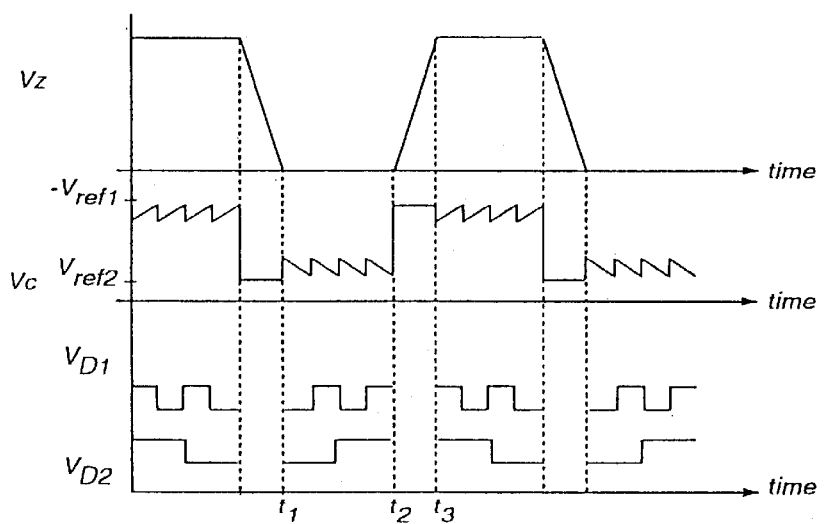
FIG. 19 is a timing diagram for FIG. 18.

A modification to the circuit in FIG. 15 incorporates a multiplicity of compensation capacitors. In FIG. 18 the capacitors have a relationship such that $C_{D(1)}$ is twice $C_{D(0)}$, and $C_{D(2)}$ is twice $C_{D(1)}$ and so on to the nth capacitor. Then $V_{D(0)}$ to $V_{D(n)}$ only need to change between two levels, simplifying the circuitry for driving the respective $V_D$s. It is not required that the $V_D$s be limited to only two levels. This arrangement forms a capacitive digital to analog converter. This is especially useful when the capacitors are formed on an integrated circuit between the part of the sensing electrode 170 on an integrated circuit and the substrate or conductive layers of the integrated circuit. FIG. 19 shows the voltages for FIG. 18 in a manner similar to FIG. 16. While it is not shown in any of the figures, it is possible to use just one reference level, and look for the voltage level to either go over, or go below the reference, depending upon the polarity of the difference between Vz and Vc.

As is described above in detail, charge removal, electric field generation and leakage compensation can all be interrelated depending on the sensing medium used. For example, when a piezoelectric sensor is used, no charge removal is required because the piezoelectric material induces charge of one polarity when stressed one way, and the induced charge is removed when the stress is removed. Charge of the opposite polarity can be induced when stress is in the opposite way. The charges induced in the piezoelectric material are not mobile. They do not conduct through the material to any significant degree. Thus this is termed induced charge or non-mobile charge. It is to be understood that these non-mobile charges do cause charges to move in the various conductors on which electric field lines from the material terminate. This is how a voltage is induced on the sensing electrode.

Figure 20:
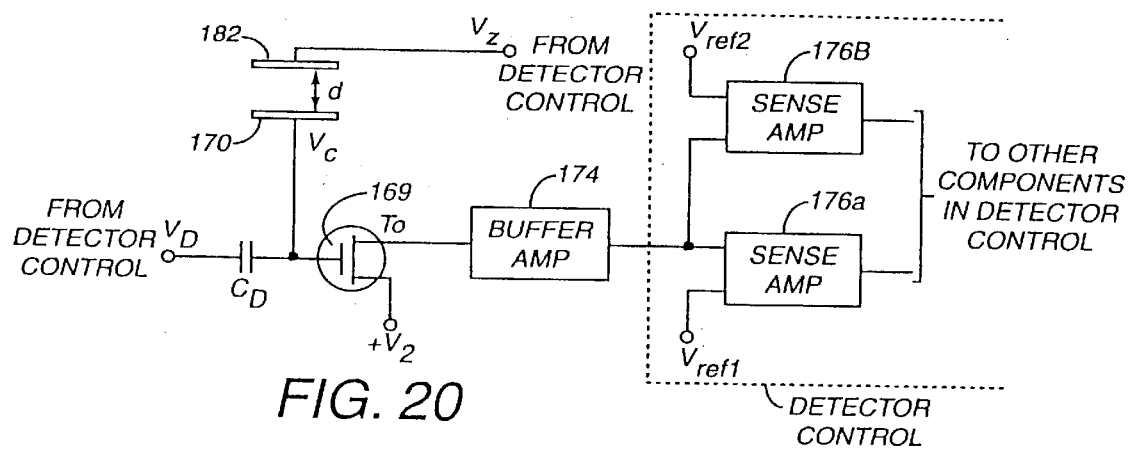
FIG. 20 is a modification of the circuit in FIG. 15 applied to a situation where there is no significant net charge conduction through the separation medium.
Figure 21:
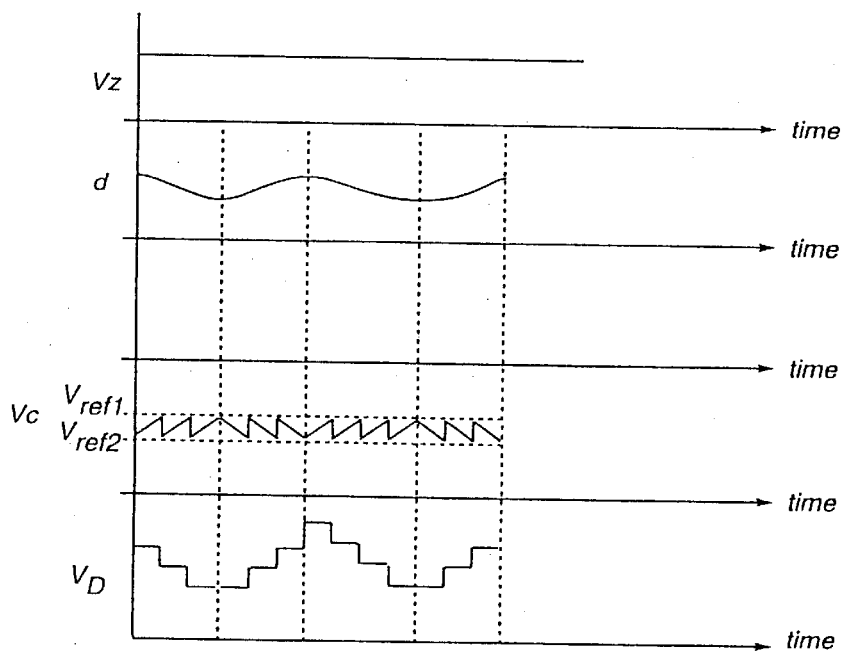
FIG. 21 is a timing diagram for FIG. 20.

FIG. 20 shows this circuit used with an induced charge sensor like a capacitive or electret microphone. As sound pressure changes the gap d between electrodes 182 and 170, a charge is induced on the sensing electrode 170. As shown in FIG. 21, as d decreases, positive charge is induced on the sensing electrode 170, causing Vc to rise. When Vc reaches $V_{ref1}$, $V_D$ is decreased. As d increases, Vc is driven negative. When Vc reaches $V_{ref2}$, $V_D$ is increased. In this instance, because the signal varies between two limits, by properly selecting the gap d and the capacitances, it is not necessary to change the bias electrode voltage $V_z$, although this could be done if there were a benefit to extending the dynamic range thereby. FIG. 20 is applicable for use in other cases where there is no net charge motion, for instance with an inductive pick up coil, piezoelectric materials, and an antenna for electric field monitoring. Inductive pick ups or coils are not commonly thought of as a sensor that can benefit from an electric circuit as described herein where the bias and leakage currents are significantly reduced. However, as the inductive coils are made smaller and more sensitive, there are benefits to having little or no current drawn through the inductive pick up.

Even without the conducting path through switching transistor $T_1$, leakage can still occur through other paths. It may be necessary to include a guard ring as one of the electrodes (for example, $E_3$) and/or around the sensing pad (for example, $E_1$ or $E_2$) to minimize leakage over the silicon dioxide layer in the integrated circuit and the passivation materials on that integrated circuit. One method of compensating for stray capacitance and stray electric fields developed by components internal of the integrated circuit is to have the guard electrode at the same potential as the sensing electrode 170. The geometry of the guard and the sensing electrode would be chosen such that the guard receives few of the flux lines of the electric field but surrounds the sensing electrode, thereby interrupting any surface leakage from the internal components. In a currently preferred embodiment, a large volume sensing medium would utilize integrated circuit control without switching transistor $T_1$ and utilize electric field reversal. Then, the same or a different integrated circuit senses the accumulated charge from a second smaller volume sensing medium utilizing the simplest sensing circuit illustrated in FIG. 9. No leakage compensation is necessary in this simple circuit because the count from the small volume sensing medium is recognized only if the charge generation rate is high. Also, in the radiation monitor discussed previously, this ion chamber configuration would be repeated for each of the three tissue depths at which a measurement is to be made.

Figure 22:
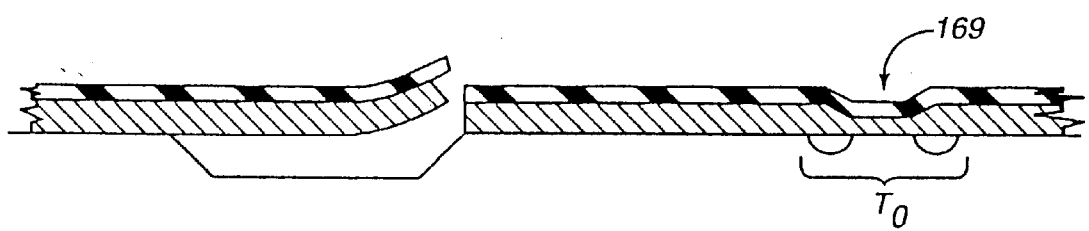
FIG. 22 is a schematic of the surface of an integrated circuit with a switch built thereon.

As shown in FIG. 22, another charge removal strategy is to use a physical switch closure or relay to remove charge from the gate 169 of transistor $T_0$. It is preferable that this be made on the same piece of silicon as the transistor $T_0$ through various micromachining techniques, or it could be implemented by a discrete relay such as a reed relay, which could replace $T_1$. It is advisable to have guard conductors surround any conductors which are connected to the gate 169 of transistor $T_0$. The remainder of the circuit can operate as shown in FIG. 9.

Figure 23:
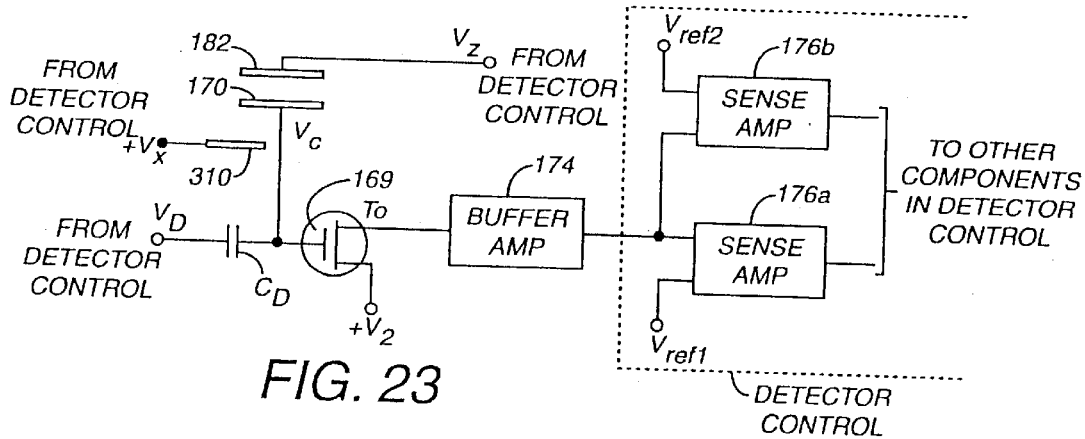
FIG. 23 illustrates the use of a pulsed charge source to remove charge from the sensing electrode.

Another charge removal strategy would be to controllably induce charge in the high impedance sensing medium, into the adjacent or surrounding medium or the medium used in the separation between capacitor plates in order to neutralize the built-up charge on the sensing electrode. This involves the intentional creation of charges or currents of a specific polarity in a specific region, unlike the situation discussed in FIG. 13 where changing the polarity of the field between the bias and the sensing electrodes brings only charges of the opposite polarity created by the phenomena of interest to the sensing electrode. Ways to create charge include thermionic emission, field emission, corona discharges, ultraviolet light, charge injection from a junction in a semiconductor, and electrically gated charge sources, for instance ions in a gas caused by an alpha particle emitter. FIG. 23 illustrates a circuit that utilizes this. Electrode 310 is equipped with a field emitter such that bringing Vx negative with respect to Vc causes electrons to move from electrode 310 to electrode 170. This removes or cancels some of the positive charge that had been transmitted to the sensing electrode 170 due to the physical phenomena of interest occurring in the volume between the bias electrode 182 and the sensing electrode 170. For some solid and liquid media, simple electrical contacts may be used, which preferably has non-linear properties to prevent conduction until some specific voltage difference is achieved. It may also be possible to use the leakage over insulator surfaces, which has been and will be discussed as something to be minimized, in a controlled manner to remove charge from the sensing electrode. These charge removal mechanisms can be configured to eliminate dead time during charge removal by measuring the amount of charge removed upon each activation and using this to calibrate the amount of change that $V_D$ has to undergo each time charge is removed.

Another method to remove charge is to have charges tunnel through the insulator between the sensing electrode/ transistor gate 169 and a conductor or diffusion, including "true" quantum mechanical tunneling through an insulator, field emission into the insulator's conduction band, or "hot carrier" emission into the insulator with subsequent transport to the sensing electrode. These methods are currently used in programming EPROMs (electrically programmable read only memories). They are used to transport charge to floating gates within the insulating layers of an integrated circuit. They are not used to actively remove charge from sensing electrodes as proposed above.

A final method of removing charge from the sensing electrode uses controlled or intentionally induced leakage over the surface of the insulator. Discussed above is the use of guard rings which are kept at a voltage very close to that of the sensing electrode. However, if the guard ring or some segment of a conductor near the transistor gate is normally kept at the guard ring voltage, and is then periodically made significantly different from that voltage, charge could be conducted over the surface of the insulator to remove charge from the sensing electrode.

Figure 25:
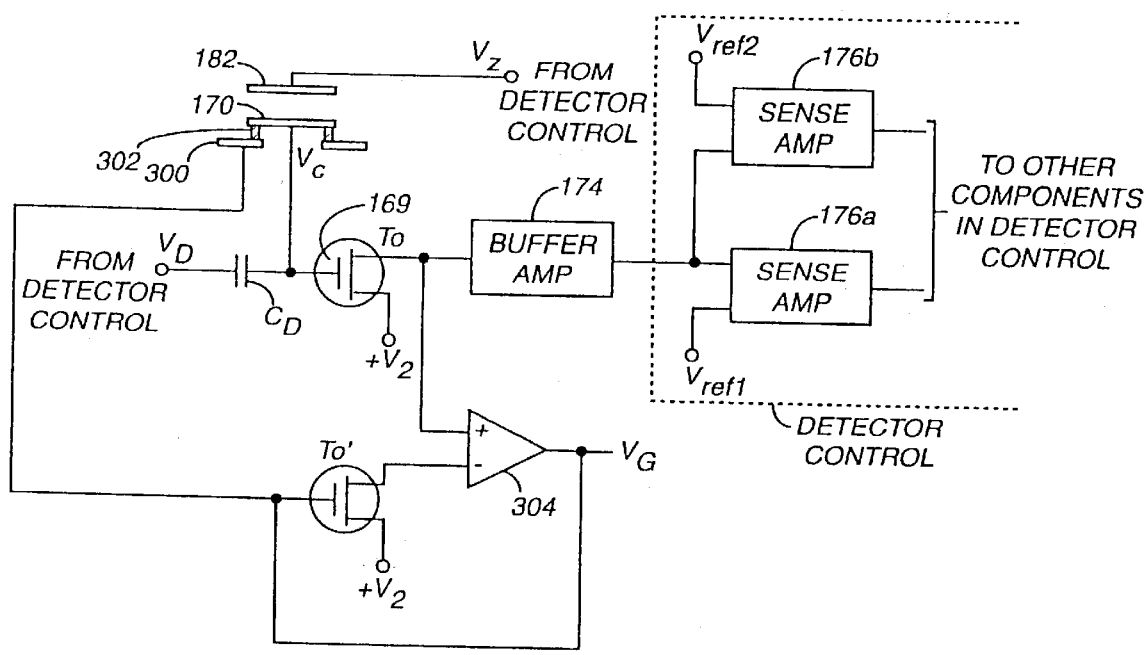
FIG. 25 illustrates the use of a guard electrode and the circuit to drive it.
Figure 26:
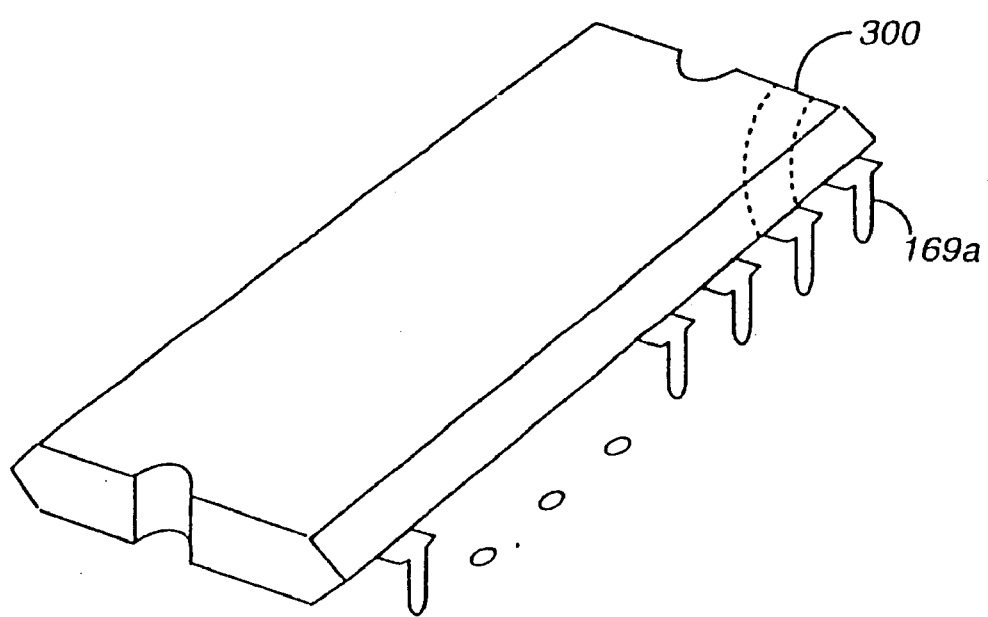
FIG. 26 illustrates the use of a guard electrode on an integrated circuit package.

When manufacturing the electronic circuit described above, a key component is the sensing electrode 170 and every circuit component directly electrically coupled to it. In FIG. 15 this includes the gate 169 of transistor $T_0$ and one electrode of the compensation capacitor $C_0$. Care has to be taken to minimize leakage currents through and over the surface of all insulators that support everything electrically coupled to this circuit node. At normal temperatures and voltages, leakage through the insulators is not significant. Leakage over the surface of the insulator is often significant. As mentioned before, using guard rings which are driven to a voltage very close to that of the sensing electrode 170 is a good method of reducing these leakage currents. A circuit to accomplish this is shown in FIG. 25. A duplicate transistor to $T_0$, $T_0$, is put into the feedback path of an op-amp 304 voltage follower circuit. Thus except for minute differences between the two transistors, the voltage $V_G$, from the output of the op-amp 304, applied to the guard electrode 300 will be identical to that of the sensing electrode 170. The sensing electrode 170 is supported by insulator 302 which is supported by guard electrode 300. Because the voltage difference between guard electrode 300 and sensing electrode 170 is very small, there will be little leakage current over the surface of the insulators. And, because electrode 300 is driven by an operational amplifier 304, it can be supported by insulators (not shown) and leakage over those insulators to the guard will not affect the voltage of the guard electrode 300. This configuration could be implemented on the surface of the integrated circuit, with the sensing electrode 170 in the middle of a conductive guard ring, with transistor $T_0$ (with no exposed surfaces) also part of the integrated circuit, and capacitor $C_0$ formed between the sensing electrode 170 and substrate or a buried metal layer of the integrated circuit. The use of a guard ring is not limited to the silicon that transistor $T_{01}$ is formed on, but can be beneficially extended to all insulator surfaces which are electrically coupled to the sensing electrode 170. It is common to build guard rings on printed circuit boards because the flux from assembly often leads to significant leakage. (See Motorola data sheet for part #MC144468.) It is useful to also build guard rings on the surfaces of integrated circuit packages to minimize leakage over package surfaces. FIG. 26 shows the output pin 169a of the transistor gate 169. The conductive guard material surrounds the pin 169a so that any leakage over the surface of the package is intercepted and does not reach pin 169a. The guard material is electrically connected to the pin adjacent to 169a, which is driven at a guard potential, as for example by the circuit in FIG. 25.

The circuit shown in FIG. 25 also has an additional benefit. Having a guard electrode that follows the potential on the sensing electrode reduces and/or nullifies the capacitance between the guard element 300 and the sensing electrode 170 and therefore increases the sensitivity of the circuit. FIG. 25 is drawn using the bias electrode 182 control circuit similar to that of FIGS. 15 & 16 where the $V_z$ remains steady between transitions. To further increase the circuit sensitivity, it is possible to have the bias electrode voltage "ride on" or follow the guard voltage as well. (This will be shown in FIG. 30.) This decreases or eliminates the effect of the capacitance between the collecting electrode and the bias electrode. At this point the sensitivity is a function of the gate capacitance of the transistor $T_0$ which can be made relatively small. This strategy can be applied to other conductors which have a capacitance to the collecting electrode, including the compensation capacitors of FIGS. 14 or 18 for instance.

One difficulty in manufacturing the integrated circuit is that during manufacture, test, storage, or handling, the gate 169 of transistor $T_0$ can experience charge build up or static accumulation sufficient to destroy the transistor. Generally, this is prevented by connecting the gate of the transistor to a diode in the substrate of the transistor or integrated circuit. Connecting the transistor gate 169 to the diffusion region of transistor $T_1$ in FIG. 9 or 10 can be sufficient if $T_1$ is on the same semiconductor substrate as $T_0$. This is a permanent connection which serves to protect the input transistor $T_0$ from static electric discharge. However, this would cause leakage current when the circuit is operating. This leakage may be acceptable in some applications and unacceptable in others. A way to overcome this problem is to electrically connect the gate of $T_0$ to the guard ring during manufacture. The guard ring is in the same semiconductor substrate and is either connected by a diode to the substrate or is driven by a transistor on the same substrate, which will cause charge generated on the gate during manufacture to be dissipated to the substrate. After manufacture and initial test, but before use in an application, the leakage current path is eliminated by breaking the small conductive bridge from gate 169 to the guard ring 300. This can be accomplished by any one of several methods, including laser evaporation, chemical etching, mechanical breaking, or by forcing enough current through the conductor that it is dispersed (i.e., fuse blowing). The connection from the gate of $T_0$ does not have to be to the guard ring, but can be to any static dissipating structure. After manufacture, the conductive link to the static dissipating structure can be removed.

Figure 29:
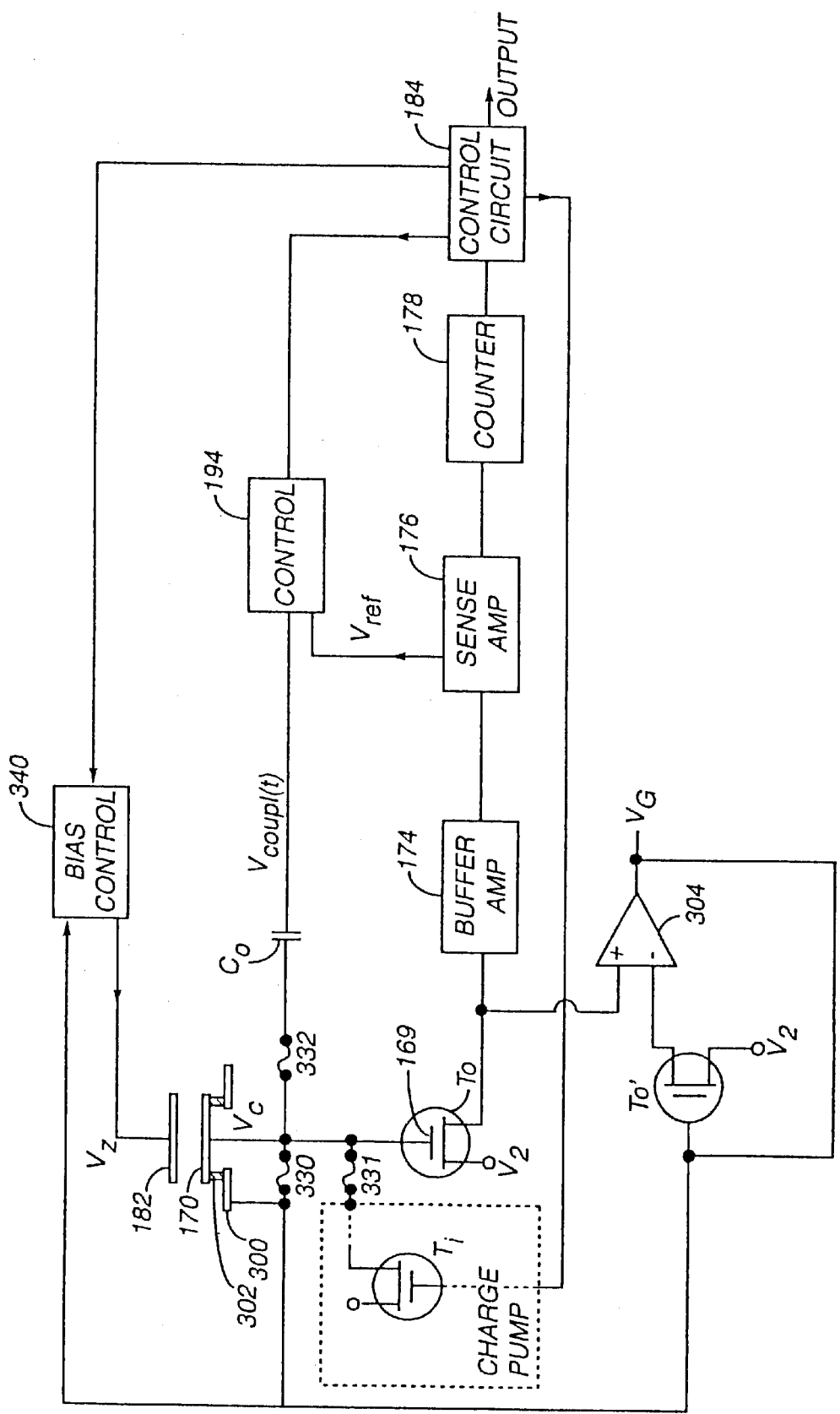
FIG. 29 illustrates an example approach for building the circuit to allow removal of conductors as needed to provide for various operating modes and/or eliminate various leakage paths.

This approach of building the circuit and then removing conductors as needed could help create a circuit that is more flexible and sensitive by combining several of the strategies mentioned herein. FIG. 29 shows a circuit which is built to potentially use a number of the methods described above. Removable elements (as described above in relation to static protection), connect the gate 169 of $T_0$ to a number of circuit elements. Removable element 331 connects it to a "charge pump". In this figure the "charge pump" includes $T_1$, representing the two transistor arrangement discussed in connection with FIG. 9. The "charge pump" could also be any of the methods discussed in connection with FIG. 23, or any other method which removes packets of charge. Removable element 330 connects to the guard element 300. This is for static protection during manufacture, as discussed above. It is not needed if the "charge pump" is able to dissipate the charge. Removable element 332 is connected to the coupling or compensation capacitor $C_0$. If only the "charge pump" is to be used, it may be useful to open element 332, or it is possible to have $V_{coupl(t)}$ follow $V_G$ and thus eliminate the effect of capacitance $C_0$ without disconnecting it. In fact, even after opening a removable element, there is still a capacitance between the open ends of the conductors, so applying $V_G$ to the side not connected to the transistor gate 169 will help reduce the effect of this capacitance. Element 340, bias control, is used to accomplish the feature mentioned above of adding $V_G$ to the bias, to practically remove the effect of the capacitance between the bias and collecting electrodes.

Figure 30:
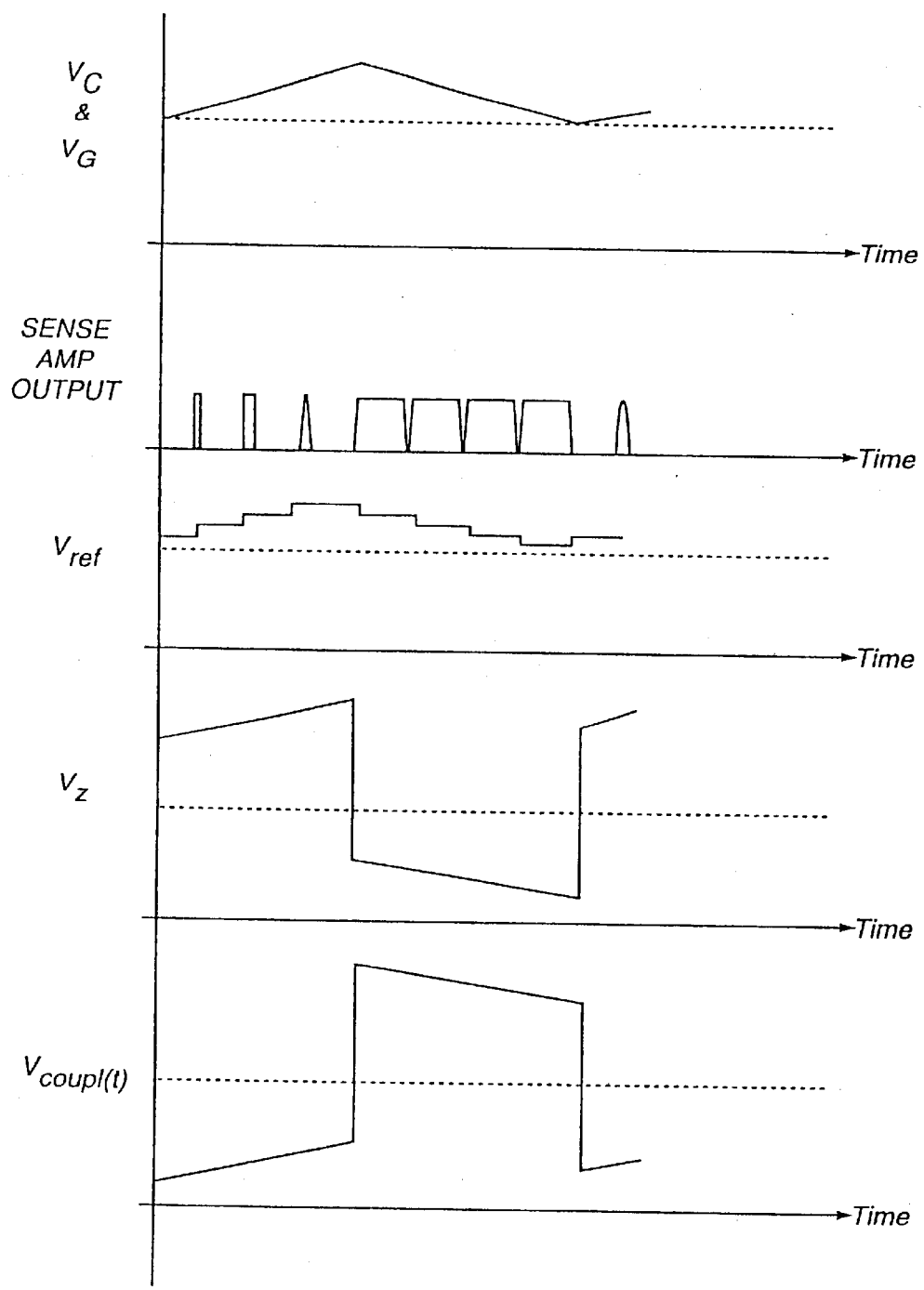
FIG. 30 illustrates an operational waveform for FIG. 29.

FIG. 29 also shows a useful connection which has not been discussed previously. $V_{ref}$ of 176 is driven by control 194. An example set of voltage waveforms is shown in FIG. 30. As sensing electrode 170 collects charge and voltage $V_c$ increases, the sense amp is triggered. When the sense amp is triggered, the counter is incremented and control circuits 184 and 194 combine to increased $V_{ref}$ by a corresponding amount to restore the sense amp 176 output to zero in this case. Each increment has the effect of compensating for some charge collected, although it does not couple to the sensing electrode 170. When $V_{ref}$ reaches the chosen upper limit, the control circuit stops incrementing $V_{ref}$ and activates another means to remove or compensate for the charge on the collecting electrode. This could be by changing $V_{coupl(t)}$ through use of a "compensation capacitor", as is shown in FIG. 14, removing charge via the "charge pump" as is shown in FIG. 11, or as is shown in FIG. 30, changing $V_z$ and $V_{coupl(t)}$ similar to that discussed in relation to FIG. 15. Now charge of the opposite polarity is brought to the sensing electrode 170 and the counter 178 and control circuit 184 and 194 look for the output of the sense amp to go low, and indicate that $V_{ref}$ needs to be reduced by a corresponding amount. Operation continues in this direction until $V_{ref}$ reaches its chosen lower limit. Then $V_z$ and $V_{coupl(t)}$ are switched again. $V_z$ and $V_{coupl(t)}$ are switched at the same time but in opposite directions so that the net effect on $V_c$ is small or 0. This isn't required but simplifies the circuit and increases the amount of charge that can be collected before a bias change is again needed. Also notice that the bias $V_z$ and the compensating capacitor $V_{coupl(t)}$ have a slope to them. This is because they are "riding on" or following $V_G$ to reduce the capacitance of those electrodes to the collecting electrode. This has been discussed above as a way to reduce the effect of these capacitances.

FIG. 29 is only one of many useful combinations of the novel circuit concepts disclosed herein. Only a few key circuit elements needs to be on the same semiconductor substrate as $T_0$. The circuit need not utilize removable elements if no configuration changes after manufacturing are to be made. Variations in operation could be made reversibly by the control circuit 184 activating different charge compensation or charge removal methods depending upon circumstances. It should also be noted that counter 178, and control circuits 184, 194, and 340 are separated for explanation only. These functions can be performed by a single circuit, preferably a microprocessor, and the counter does not need to be an actual counter, but can be a register or memory location that can be changed as needed. These can be considered to be part of detector control circuit 14 in FIG. 1. The many possible combination circuits, with FIG. 29 being one example, also provide economies of scale because one circuit can be manufactured with any strategy or combination of charge removal strategies among bias reversal, charge compensation, charge removal through $T_1$, charge removal through physical contact closure, charge removal thought induced conductivity in the sensing or insulating medium, charge transport through insulating layers, induced charge transport over insulator surfaces. The choice to use one or more of these discharge mechanisms could either be made dynamically by the detector control circuit 14 or permanently during or after manufacture of the circuit or detector subassembly.

Another technique to help minimize leakage current is to have the circuit operate in a dry environment. Water adsorbed onto the surface of an insulator is a significant contributor to leakage currents. One strategy is to have the high impedance medium dried and kept dry by using a desiccant. To go even further, it has been found useful to wash the relevant surfaces of the circuit with deionized water, alcohol, and then acetone. The water, a polar solvent, will tend to remove ionic contaminants from the surfaces. Alcohol dissolves both polar and non-polar molecules, removing much of the water some polar, and some non-polar contaminants from the surface. Acetone removes the alcohol and other non-polar solvents, while also in some instances leaving a non-polar residue which helps minimize water absorption and ion motion.

These improvements in low leakage transistor and integrated circuit manufacture have broader applications beyond the specific circuits and applications disclosed herein. They can be used to create more effective MOSFET inputs to normal operational amplifiers (integrated or hybrid) that have significantly lower leakage currents than present devices. A transistor or circuit manufactured with guard rings on the silicon, proper washing, and a fusible link to diode protection would confer these benefits. Use of compensation capacitors could help reduce transistor offset differences. It would be best if the packaging also incorporated guard rings as discussed above. To protect the device from static during manufacture, the fuses must be retained until after the transistor is wire bonded into a package in which wire loops short all the leads together until the package is placed into the device. Or some other removable shorting mechanism can be used, as long as it leaves no residue and connects at least the sensing electrode/transistor gate to one of the transistor terminals, drain, source, or substrate. Then the shorting element is removed under static safe conditions for correct operation. This use of shorting wires is already done with discrete MOSFETs, but the innovations of on silicon and on package guard rings, fusible links to diode protection, and of washing as suggested above is not done. In this disclosure integrated circuit refers to a circuit where two or more circuit elements are manufactured on a single semiconductor substrate. A single transistor or other circuit element is not considered to be an integrated circuit element. For instance, the integrated circuit could be as simple as transistor $T_0$ and the compensation capacitor $C_0$ from FIG. 14A, it could be two or more of the compensation capacitors referred to in FIG. 18, or it could be the multiple electrodes of FIGS. 2 to 4. The integrated circuit could be so inclusive that it contains all the necessary circuit elements.

Many ways have been discussed above to minimize leakage currents. FIG. 12 introduced the idea of using a duplicate circuit when compensating for leakage current. If the goal is simply to monitor the leakage current and make a decision if it is too great (since leakage current increases greatly with temperature), a duplicate circuit may be employed, or a simpler circuit could be used to measure the leakage from a junction. In addition, certain leakage current sources are independent of or unaffected by field reversal. With a relatively constant input, the output could be measured with a positive and then with a negative bias field with the difference providing a measurement of these independent leakage currents. As mentioned, the leakage currents over the surface of the transistor or circuit may be the most problematic. Even if the circuit is well designed and cleaned, contaminants from the environment will adsorb on the surface. With enough contaminants, leakage current may become significant. It is possible to create a leakage current monitor to check for leakage currents and alert either the detector assembly, the system that the assembly is part of, or the human user when leakage currents are significant. The simplest strategy is a set of interdigitated electrodes with one electrode at a bias voltage and the other electrode connected to one of the charge measurement circuits presented above. The interdigitated structure gives the most leakage current for a given area. It is important to not have the voltage difference so great that leakage currents are produced even when there is no significant leakage to the actual sensing electrodes of the detector subassemblies. One of the detector subassemblies could be dedicated to this leakage current monitoring.

Figure 27:
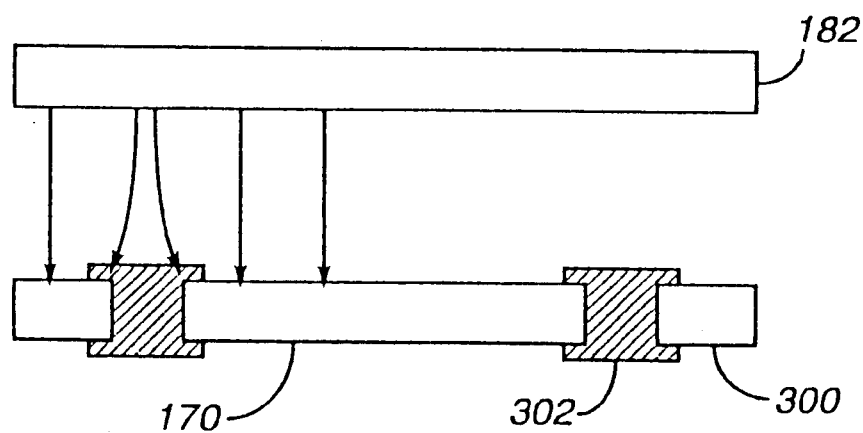
FIG. 27 illustrates field lines interacting with the surface of an insulator.
Figure 28:
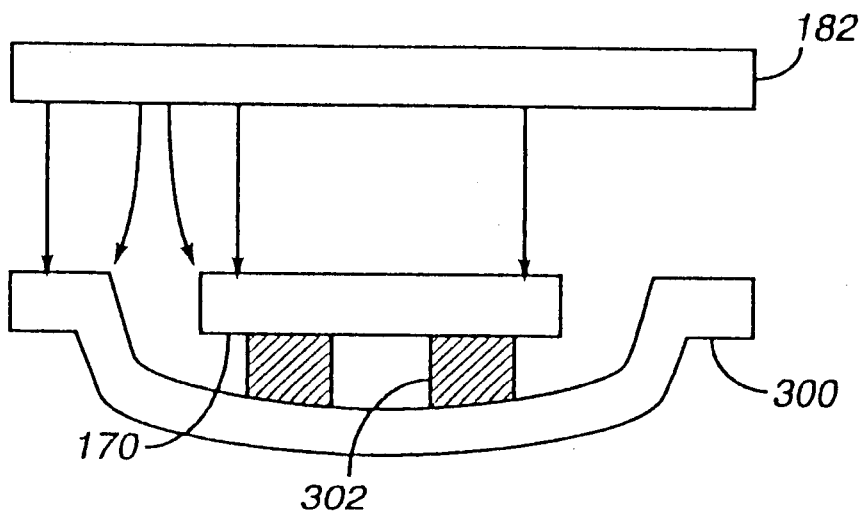
FIG. 28 illustrates an example arrangement where field line do not interact with the surface of the insulator.

For detectors operating with conventional circuits in FIGS. 5 through 8 or for circuits with a constant bias voltage, any leakage currents over insulators caused by bias fields will reach a stable state. However, with the novel circuit operation described herein, because in some instances the bias field magnitude or polarity is changed, this change can induce surface charge movement on insulators. This surface charge movement can induce charge on the sensing electrode whether or not the insulator is connected to the sensing electrode. This can be minimized by arranging conductors and insulators so that no electric field lines from the sensing electrode terminate on or pass through insulator surfaces which can have leakage currents. FIG. 27 shows a situation where insulator leakage can induce currents and FIG. 28 shows a situation where the guard electrode 300 shields the sensing electrode 170 from charges induced on the surface of insulators or where charges move over the surface of the insulator.

While not preferred because of size, weight, and power requirements, both the leakage from any discharge transistor and over the surface of insulators can be reduced by significantly cooling those parts. This may useful when there is no additional hardship in accomplishing it; for instance, when the sensing medium itself is cooled to improve its performance.

A significant benefit of the charge removal or compensation circuits discussed above is increased noise immunity or increase ability to operate with significant noise. In all of the circuits presented herein the preferred method is to have charge removed or compensated for in packets or quantities, hereafter termed charge packet reset, rather than the collecting electrode being reset to a specific voltage. Voltage reset means that the point being reset is restored or reset to a specific voltage. Voltage reset has been discussed in relation to FIG. 9 and is possible with a number of the circuits disclosed herein. Voltage reset has the benefit that fewer circuit components are needed. In FIG. 9, one transistor would be needed for voltage reset, whereas 2 transistors, a capacitor, and associated control circuitry are needed for charge reset. Prior art circuits shown in FIGS. 7 & 8 use voltage reset. Closing the switch resets the capacitor voltage to 0 volts.

If there is no significant noise on the signal, then voltage reset and charge packet reset behave similarly, and so voltage reset may be preferable because it is simpler, although it does have the drawback of dead time during the reset. But in applications such as are envisioned herein, the goal is to increase the lower limit of sensitivity to the point where noise may be significant. Detecting the signal with significant AC noise is a big benefit. The noise could be from the phenomena being measured, from the sensing medium, from circuitry, or from external electrical or physical (vibration) signals coupling into the device. Charge packet reset can operate with noise much larger than the size of the charge packet, as will be shown below.

Consider FIGS. 31a to 31f. They represent the charge collected on the collecting electrode 170 and thus the voltage on the gate 169 of transistor $T_0$ in FIG. 9. They assume a constant charge arrival rate and a sinusoidal noise source. If there were no noise, the voltage would ramp up to 1 unit at 1 second and then be reset. The threshold in this simulation is 1 unit, so there should be a reset every second. A time to accomplish the reset of 0.1 seconds is used. FIGS. 31a, 31c, and 31e show the charge or gate voltage levels with charge packet and increasing noise amplitudes. The times when a reset occurs are indicated by a negative going pulse. FIGS. 31b, 31d, 31f show the voltage levels with voltage reset for the corresponding charge arrival and noise amplitudes. The times when a reset occurs are indicated by a positive going pulse. As mentioned above, with low noise amplitude, shown in FIGS. 31a and 31b, the performance of charge packet reset and voltage reset are similar. However, the problem of dead time during voltage reset is evident. Because no charge is collected during the voltage reset time, the period between pulses is longer than the 1 second that it should be. FIGS. 31c and 31d show the situation where the noise is about 70% of the reset threshold of 1 unit. The charge packet reset measures the correct number of pulses, 7, while the voltage reset had 9 resets, two more than correct. (The fact that the initial pulse occurred early is because the simulation starts with no noise or charge at time=0, which is not the steady state.) In FIGS. 31e and 31f, the noise amplitude is larger (about 2×) than the reset threshold. Here it is obvious that voltage reset cannot work, having 20 resets in 7 seconds. But charge packet reset still works very well. After a couple of initial resets, the rate of the pulses is exactly what would be expected, averaging one per second.

One way to think about this beneficial behavior of charge packet removal is to picture that information is conserved with charge packet removal. A known amount of charge is removed each time. Any extra charge remains on the collecting electrode. But, with voltage reset, it is not known how much charge was really removed. It is only known that at least a specific amount of charge was removed, and if the noise changes quickly enough compared to the reset time, even that is not known.

Another way to think about this beneficial behavior of charge packet removal is to picture the comparator being triggered by or following the edge of the combined signal and noise "envelope". The comparator would follow first the upper edge of the envelope and then, as the field reversal occurs, switch to following the lower edge of the envelope. If the noise changes amplitude significantly, there will be pulse jitter or transient increases or decreases in pulse rate, but these will average out over the long term or will not be significant compared to the period of measurement.

A benefit of charge packet resetting is that it does not matter when the reset occurs. This allows power conserving modes where the circuit "sleeps" to conserve power, then wakes up, makes a comparison to the threshold, removes a packet of charge, makes another comparison and continues doing this until the measurement is below the threshold. Then the circuit knows that the total charge collected during its sleep period was the number of packets that have been removed. This also makes it possible to use time sampled circuits, like clocked comparators similar to those used in DRAM memories, rather than linear amplifiers. Again this saves power and simplifies circuitry. And, as mentioned earlier, charge packet removal enables the circuit to operate-in a null mode, or to operate at specific operating points. This relaxes the linearity, gain and noise immunity requirements of the amplifier stages. For instance, offset voltages often limit the gain that can be achieved by a single stage of amplification. With charge packet removal, the full gain can be accomplished in a simple circuit because any offset just causes several initial packets of charge to cancel them out. Subsequently the offset is not significant if it does not change too rapidly during normal operation. Usually the only thing that changes offsets is temperature changes.

A further improvement in operation is to dither the charge packet removal. (This can only be done with methods that compensate for the charge, or for schemes where charge packets of either polarity can be removed. Removal of charge packets of either polarity can be done by having Vchg in FIGS. 9, 10, 11, and 12 be able to be either positive or negative with respect to the voltage on the sensing electrode.) Consider the waveform shown in FIG. 16 for this discussion between $t_1$ and $t_2$. If $V_C$ goes below $V_{REF2}$, $V_D$ is incremented and one charge packet is removed. When the next comparison is made, if $V_C$ were again below $V_{REF2}$, $V_D$ would increase one more step. If $V_C$ were not below $V_{REF2}$, then no change would be made to $V_D$. In dithering, if $V_C$ were not below $V_{REF2}$, then $V_D$ would actually be decreased by one step. This effectively restores a charge packet. Then at the next measurement $V_C$ would be below $V_{REF2}$, and $V_D$ would be incremented. However, if after decreasing $V_D$, $V_C$ was still not below $V_{REF2}$, this would mean that the noise amplitude had decrease or some other event had happened, maybe even a change in the physical phenomena for bipolar sensors such as pressure gauges and capacitive microphones. Thus $V_D$ would be decrease again, effectively removing another charge packet. This can continue until the $V_D$ reaches a limit, or indefinitely if the charge packets are actually being removed through any of the various charge pump methods. This allows a simple comparator to follow changes of both polarities.

Charge packet removal or charge removal refers to both actual removal of charge of either polarity from the collecting electrode, or compensation for specific amounts of charge either directly on the compensating electrode or effectively doing so, such as changing $V_{REF}$ to sense amp 176 in FIG. 29. Also, in the preferred embodiments, all charge packets would be of equivalent size, but in some situations, such as that of FIG. 29, packets removed by changing $V_{REF}$ could be significantly smaller than those removed by changing $V_{coup(t)}$ thereby extending the total dynamic range of the circuit. Or, the charge packets could vary in size because of circuit non-idealities or for some other reason. It could be that the specific charge packet size is known, or it could suffice that the average size of the charge packets is known.

It should be noted that this is very different than normal semiconductor operation where the term charge packets are used. In charge coupled devices, CCDs, packets of charge are collected in potential wells, moved about the integrated circuit, and eventually the amplitude of these packets are measured. These packets are removed from the potential wells in which they were collected and stored, but as they are removed from the circuit, they are measured. The size of the packets vary and is a measure of the amount of light striking that region. In other applications such as DRAMs (dynamic random access memories) charge packets of specific sizes are stored on a capacitor to indicate binary information. These packets are subsequently removed when reading the information. Again, the charge packets are the signal itself. The charge packets are not being used to remove or compensate for the charge collected. In contrast, in the situation used in the circuits disclosed herein, the measurement to be made is being quantized into a number of charge packets removed in a specific period of time.

This concept can be applied to radiation detectors which presently use Geiger-Mueller tubes, scintillators and photomultipliers, or solid state detectors where the decreased absorption of a gas filled ion chamber (when compared to a solid material) is not important. Also, due to their low input capacitance and resulting high sensitivity, the radiation detectors can replace proportional counters which use multiplication within the gas. This concept can also replace passive detectors, such as film or thermoluminescent detector material, in applications or apparatus where immediate readout would be advantageous. This includes but is not limited to radon monitoring and occupational monitoring.

Use of the circuitry of the present invention is not limited to detecting ionizing radiation. Any phenomena that produces mobile or non-mobile charges in a sensing medium can be used. In those cases where the sensing medium produces a self-induced electric field, circuits to power the bias and sensing electrodes may be unnecessary, since the material between sensing electrode 155 and bias electrode 156 itself establishes the reference voltage and the electrodes close the circuit path; for example, when a piezoelectric sensing material is used to generate an electric field when placed under stress, or when work function differences of the electrode are involved in sensing the phenomena to be measured. The circuits described herein are thus more broadly applicable to a number of sensing media which face limitations, imposed by the electronic measuring circuits, on their ability to measure physical phenomena. These media include solids, liquids, or gases in which the physical phenomena to be sensed causes the generation of mobile charges which then move under the influence of an electric field, or in which a charge separation is induced by the physical phenomena and/or dimensional changes. Specific examples of media are gases in the case of ionizing radiation, electrochemical mixtures, electret or capacitive microphones, variable capacitors, electric field antennas or measuring equipment, inductive pickups or coils, piezoelectric materials such as PVDF, semiconductors operated at temperatures where thermally-induced current generation is not dominant, a vacuum in the case of electron emissive surfaces or ion mobility instruments, and insulators. The limitations imposed by the measuring circuits include sensitivity, linearity, size, dynamic range, frequency range, and operating voltages. These limitations arise from thermally-induced and/or bias currents in the components of the measuring circuit and current leakage paths over the surfaces of and/or through the components of the measuring circuit. The measuring circuit described herein aims to minimize these limitations. Moreover, any of the described methods of improving circuit performance can be combined with any detector or sensing medium described above. For example, depending on the type and volume of sensing medium used, and the desired rate of measurement, a charge pump, charge pump with leakage compensation, bias reversal or compensating capacitor, (or any combination thereof) may be used to reduce leakage current or electrical noise in comparison to the commonly used circuits illustrated in FIGS. 5–8. For sensing mediums using unipolar accumulated charge for which the bias cannot be reversed, such as some electrochemical cells, a charge pump is preferred over bias reversal because bias reversal has no effect on removal of accumulated charge in a unipolar situation, leading to possible buffer amplifier 174 circuit saturation due to the accumulated charge. For sensing mediums using bipolar accumulated charge, bias reversal and/or use of a compensating capacitor is the preferred method for reducing leakage current because they cause less leakage than a charge pump. For sensing means using induced charge, a compensating capacitor is preferred because by removing induced charge it increases the range of voltage which can be measured from the sensor and thereby reduces the possibility of buffer amplifier 174 saturation. Aside from noise reduction and leakage current considerations, use of a compensating capacitor can provide a benefit in terms of extended power supply operating life and increased sensor operating efficiency through reduction of electric field reversal time and increase of field reversal period (the combination of which acts to increase the sensor duty cycle).

While only certain preferred features of the invention have been shown by way of illustration, many modifications and changes can be made. It is to be understood that the appended claims are intended to cover all such modifications and changes as fall within the true spirit and scope of the invention, as embodied in the following claims.

What is claimed is:

1. An electronic circuit for measuring charge, voltage or current, comprising:
   (a) input circuit elements configured for sensing charge, voltage, or current to provide an output signal which is a function of the charge, voltage or current being measured wherein said input circuit elements comprise a transistor whose gate is electrically connected to the source of said charge, voltage, or current;
   (b) amplification circuit elements connected to said input circuit elements and configured for amplifying said output signal to provide said measurement; and
   (c) measurement control circuit elements configured for measuring said charge, voltage, or current without a continuous discharge path being coupled to at least said input circuit elements;
   further comprising charge removal elements coupled to at least said measurement control circuit elements wherein said measurements are accomplished with said measurement control circuit elements performing removal of accumulated charge from sensing elements in said input circuit and wherein said charge removal is not continuous;
   wherein said circuit further comprises circuit elements coupled to at least said charge removal elements and configured for controlling said charge removal;
   wherein charge of an opposite polarity to the charge accumulated on said sensing elements is controllably induced in or around said sensing medium in order to neutralize the charge on said sensing elements; and
   wherein said measurement control circuit elements comprise at least two circuit elements selected from the group consisting of:
      (i) a guard element in association with said sensing element and configured to minimize leakage to said sensing element;
      (ii) a charge pump circuit comprising a transistor coupled to said sensing element and configured for charge removal from said sensing element;
      (iii) a charge pump circuit comprising a physical switch coupled to said sensing element and configured for charge removal from said sensing element;
      (iv) a voltage reset circuit comprising a transistor coupled to said sensing element and configured for charge removal from said sensing element;
      (v) a voltage reset circuit comprising a physical switch coupled to said sensing element and configured for charge removal from said sensing element;
      (vi) a compensating current source circuit coupled to said sensing element and configured to reduce said voltage, current or charge below a level which permits additional measurements to be taken,
      (vii) duplicate circuit elements which are used to measure interfering currents and additional circuit elements coupled to said duplicate circuit elements which are configured to remove said interfering currents from said output signal;
      (viii) circuit elements configured for controllably capacitively coupling charge to said sensing element;
      (ix) circuit elements configured for reversing the polarity of the electric field acting in association with a portion of said sensing element to bring charge of the opposite polarity to the sensing element; or
      (x) circuit elements configured for inducing conductivity in or on an otherwise insulating material connected to said sensing element to bring charge of the opposite polarity to the sensing element.

2. An electronic circuit for measuring charge, voltage or current, comprising:
   (a) input circuit elements configured for sensing charge, voltage, or current to provide an output signal which is a function of the charge, voltage or current being measured wherein said input circuit elements comprise a transistor whose gate is electrically connected to the source of said charge, voltage, or current;
   (b) amplification circuit elements connected to said input circuit elements and configured for amplifying said output signal to provide said measurement;
   (c) measurement control circuit elements coupled to at least said input circuit elements and configured for minimizing interfering currents in said input circuit elements that cause said measurement to deviate from the actual level of charge, voltage or current being measured;
   wherein said circuit elements are configured for performing said measurement on charge, voltage or current created in a sensing medium responsive to at least one physical phenomenon; and
   wherein non-mobile charge is induced in said sensing medium by said physical phenomenon.

3. An electronic circuit for measuring charge, voltage or current, comprising:
   (a) input circuit elements configured for sensing charge, voltage or current to provide an output signal which is a function of the charge, voltage or current being measured wherein said input circuit elements comprise a transistor whose gate is electrically connected to the source of said charge, voltage, or current;
   (b) amplification circuit elements coupled to at least said input circuit elements and configured for amplifying said sensed charge, voltage or current to create said output signal;
   (c) measurement control circuit elements being coupled to at least said input circuit elements and configured for minimizing interfering currents in said input circuit elements, wherein said measurement deviates from the actual level of charge or current being measured by less than $10 \times 10^{-18}$ Amps;
   wherein said measurement control circuit elements comprise at least two circuit elements selected from the group consisting of:
      (i) a guard element in association with said sensing element and configured to minimize leakage to said sensing element;
      (ii) a charge pump circuit comprising a transistor coupled to said sensing element and configured for charge removal from said sensing element;
      (iii) a charge pump circuit comprising a physical switch coupled to said sensing element and configured for charge removal from said sensing element;
      (iv) a voltage reset circuit comprising a transistor coupled to said sensing element and configured for charge removal from said sensing element;
      (v) a voltage reset circuit comprising a physical switch coupled to said sensing element and configured for charge removal from said sensing element;
      (vi) a compensating current source circuit coupled to said sensing element and configured to reduce said voltage, current or charge below a level which permits additional measurements to be taken,
      (vii) duplicate circuit elements which are used to measure interfering currents and additional circuit elements coupled to said duplicate circuit elements which are configured to remove said interfering currents from said output signal;

(viii) circuit elements configured for controllably capacitively coupling charge to said sensing element;

(ix) circuit elements configured for reversing the polarity of the electric field acting in association with a portion of said sensing element to bring charge of the opposite polarity to the sensing element; or (x) circuit elements configured for inducing conductivity in or on an otherwise insulating material connected to said sensing element to bring charge of the opposite polarity to the sensing element.

4. The electronic circuit of claim 1 wherein said circuit elements are configured for performing said measurement on charge, voltage or current created in a sensing medium responsive to at least one physical phenomenon.

5. The electronic circuit of claim 2 or 4, wherein said sensing medium is comprised of a high impedance material.

6. The electronic circuit of claim 2 or 4 wherein said measured charge or current is accumulated on at least one of said sensing elements under the influence of an electric field.

7. The electronic circuit of claim 2 or 4 wherein mobile charge or current is created in said sensing medium by said physical phenomenon.

8. The electronic circuit of claim 7 further comprising circuit elements configured for applying an electric field to said sensing medium to collect said charge or current for measurement.

9. The electronic circuit of claim 4 wherein non-mobile charge or current is induced in said sensing medium by said physical phenomenon.

10. The electronic circuit of claim 2 or 9 wherein a change in the capacitance of said sensing medium induces said non-mobile charge.

11. The electronic circuit of claim 7 wherein the amount of charge or current created is a function of the magnitude of the phenomenon being measured.

12. The electronic circuit of claim 2 or 9 wherein the amount of charge or current created is a function of the magnitude of the phenomenon being measured.

13. The electronic circuit of claim 12 wherein said non-mobile charge creates an electric field that is proportional to the magnitude of the phenomenon being measured.

14. The electronic circuit of claim 1, 2 or 3 wherein said source of charge, voltage, or current is a sensing material affected by a physical phenomena selected from the group consisting of: the piezoelectric effect, the ferroelectric effect, the pyroelectric effect, the photoelectric effect, an inductive pick up, an electric field antenna, a liquid electrochemical material, a work function difference, or a gas, liquid or solid charge mobile medium or a vacuum.

15. The electronic circuit of claim 2 or 9 wherein said sensing medium is comprised of a material selected from the group consisting of a gas or a vacuum.

16. The electronic circuit of claim 2 or 4 wherein said charge or current is produced by ionizing radiation.

17. The electronic circuit of claim 16 wherein said charge or current is produced in a sensing medium comprising a gas which is ionized by said radiation.

18. The electronic circuit of claim 6 further comprising elements configured for receiving and processing said output signal to apply a signal to said sensing medium for reversing the polarity of said electric field to bring charge or current of alternating polarity to said sensing elements.

19. The electronic circuit of claim 18 wherein the polarity of the field is reversed by changing the voltage applied to at least one said sensing element.

20. The electronic circuit of claim 19 wherein said accumulated charge is unipolar.

21. The electronic circuit of claim 19 wherein said accumulated charge is bipolar.

22. The electronic circuit of claim 18 further comprising circuit elements configured for coupling a compensation signal to at least one said sensing element.

23. The electronic circuit of claim 22 wherein said compensation signal is capacitively coupled to said sensing elements.

24. The electronic circuit of claim 23 wherein a plurality of capacitors each couple a separate compensation signal to said sensing elements and wherein each said capacitor has a capacitance value that is twice and one-half the capacitance of the two other capacitors of closest value to permit each said compensation signal to be switched between two discrete levels.

25. The electronic circuit of claim 24 wherein said circuit forms a capacitive digital to analog converter.

26. The electronic circuit of claim 22 wherein a controller applies a varying potential to at least one said sensing element to compensate for an amount of charge or current measured by said sensing element so that a greater amount of charge or current can be measured before reversing said polarity.

27. The electronic circuit of claim 26 wherein the effect of said compensation signal is to cause said output signal to lessen in magnitude below a threshold level to permit additional charge or current measurements of the same polarity.

28. The electronic circuit of claim 18 wherein the effect of said polarity reversal is to cause said measurement to trend in the opposite direction upon approaching a limit that would prevent additional charge or current measurements.

29. The electronic circuit of claim 2 or 3 wherein said interfering currents are caused by input bias currents.

30. The electronic circuit of claim 2 or 3 wherein said interfering currents are caused by thermal noise in the circuit elements.

31. The electronic circuit of claim 1, 2 or 3 wherein said elements accomplish said measurement without the interference of input bias currents.

32. The electronic circuit of claim 1, 2 or 3 wherein said elements accomplish said measurement without the presence of input bias currents.

33. The electronic circuit of claim 2 or 3 wherein said interfering currents are caused by leakage currents in or on said circuit elements.

34. The electronic circuit of claim 33 wherein said interfering currents are caused by leakage currents in a semiconductor junction.

35. The electronic circuit of claim 33 wherein said interfering currents are caused by leakage currents in or on an insulating element.

36. The electronic circuit of claim 33 wherein said interfering currents are caused by leakage currents to or from at least one said sensing element.

37. The electronic circuit of claim 36 wherein said leakage currents to or from said sensing element are to or from at least one said amplifying element.

38. The electronic circuit of claim 36 further comprising charge removal circuit elements for removing charge from said sensing element, wherein said leakage currents travel to or from said sensing element in a path that is directed from or to at least one said charge removal element.

39. The electronic circuit of claim 38 wherein at least one said charge removal element comprises a transistor which introduces said leakage current into at least one said sensing element.

40. The electronic circuit of claim 39 wherein said transistor is a field effect transistor comprising a source or drain in a substrate or well and said leakage current is introduced to said sensing element from the diode which is formed by the source or drain in the substrate or well of said field effect transistor.

41. The electronic circuit of claim 40 wherein said interfering current minimizing elements comprise a controller for biasing the substrate or well of said transistor to maintain a potential substantially equal to the potential at said sensing element caused by said diffusion.

42. The electronic circuit of claim 33 wherein said interfering current minimizing elements comprise a controller and a current source configured for inducing current of an opposite polarity from said leakage current to flow to said sensing element in an amount controlled by said controller to minimize said inaccuracy.

43. The electronic circuit of claim 42 wherein said controller determines said leakage current by use of a duplicate discharge and amplification circuit not connected to a functioning sensing element such that the output from said duplicate circuit enables said controller to minimize said inaccuracy by controlling the output of said current source.

44. The electronic circuit of claim 43 wherein said inaccuracy is minimized by said controller performing a comparison between the output of said duplicate discharge and amplification circuit and said measurement.

45. The electronic circuit of claim 43 wherein said inaccuracy is minimized by said controller performing said comparison on proportionally scaled pulse streams.

46. The electronic circuit of claim 43 wherein said inaccuracy is minimized by said controller not counting said measurement unless the pulse rate defined by said measurement is greater than a specified amount.

47. The electronic circuit of claim 44 wherein said controller recognizes said measurement as accurate only if said measurement is greater than the output of said duplicate discharge and amplification circuit.

48. The electronic circuit of claim 1, wherein said elements accomplish said measurement without relative physical motion between said elements.

49. The electronic circuit of claim 1, wherein at least one of said elements is in relative motion with another of said elements.

50. The electronic circuit of claim 1 or 2, wherein said measurements are accomplished without removal of accumulated charge from said sensing elements.

51. The electronic circuit of claim 2 further comprising charge removal elements coupled to at least said measurement control circuit elements wherein said measurements are accomplished with said measurement control circuit elements performing removal of accumulated charge from said sensing elements and wherein said charge removal is not continuous.

52. The electronic circuit of claim 2 or 3 further comprising charge removal elements coupled to at least said measurement control circuit elements wherein said measurements are accomplished with said measurement control circuit elements performing removal of accumulated charge from said sensing elements wherein said charge removal is continuous.

53. The electronic circuit of claim 51 wherein said circuit further comprises circuit elements coupled to at least said charge removal elements and configured for controlling said charge removal.

54. The electronic circuit of claim 1 or 53 wherein said charge removal elements do not introduce significant interfering currents in said measurement.

55. The electronic circuit of claim 1 or 53 wherein said charge removal is controlled in magnitude.

56. The electronic circuit of claim 1 or 53 wherein said charge removal is controlled in time interval.

57. The electronic circuit of claim 1 or 53 wherein said charge removal is controlled in both time interval and in magnitude.

58. The electronic circuit of claim 1 or 53 wherein said charge removal is in discrete packets wherein the number of packets removed is representative of said measured charge or the rate of removal of said packets is representative of said measured current.

59. The electronic circuit of claim 58 wherein said charge removal is in consistent sized discrete packets.

60. The electronic circuit of claim 58 wherein said charge packet removal is implemented by two transistors connected in series between at least one said sensing element and a voltage source controlled so that only one said transistor conducts at a time and sequenced such that said packets are removed by said transistors and delivered to said voltage source.

61. The electronic circuit of claim 53 wherein charge of an opposite polarity to the charge accumulated on said sensing elements is controllably induced in or around said sensing medium in order to neutralize the charge on said sensing electrode.

62. The electronic circuit of claim 1 or 61 wherein said controllably induced charge is created by a method selected from the group consisting of thermionic emission, field emission, corona discharge, ultraviolet light emission, quantum tunneling, or the use of an electrically gated charge source.

63. The electronic circuit of claim 1 or 53 wherein charge is transported through an insulator to neutralize the charge on said sensing elements through tunneling, diffusion or hot carrier emission.

64. The electronic circuit of claim 1 or 53 wherein controlled leakage is induced over the surface of the insulator surrounding said sensing elements to neutralize the charge on said sensing electrode.

65. The electronic circuit of claim 64 wherein said leakage is controlled by use of at least one guard ring electrically coupled to said sensing element.

66. The electronic circuit of claim 65 wherein said guard ring is maintained at a potential substantially equal to the potential of at least one said sensing element.

67. The electronic circuit of claim 66 wherein said guard ring is periodically shifted to a voltage different from the potential of at least one said sensing element in order to induce said leakage.

68. The electronic circuit of claim 1, 2 or 3 wherein two or more of said elements is located on an integrated circuit.

69. The electronic circuit of claim 68 wherein at least the input circuit elements are located on an integrated circuit.

70. The electronic circuit of claim 69 wherein said input circuit elements comprise a collecting electrode.

71. The electronic circuit of claim 70 wherein said collecting electrode comprises at least part of a transistor.

72. The electronic circuit of claim 2 or 3 wherein said elements configured for minimizing interfering currents are not permanently electrically connected to said sensing elements.

73. The electronic circuit of claim 72 wherein said elements configured for interfering current minimization comprise a circuit activated mechanical switch or relay used to remove charge from said sensing element.

74. The electronic circuit of claim 68 wherein said integrated circuit is located in proximity to said sensing medium.

75. The electronic circuit of claim 68 wherein said integrated circuit is in contact with said sensing medium.

76. The electronic circuit of claim 17 wherein the input to said amplifying elements and said gas are maintained substantially dry.

77. The electronic circuit of claim 74 wherein the input to said amplifying elements is maintained in a substantially dry environment so that nothing conductively connected to said sensing elements leaves the dry environment.

78. The electronic circuit of claim 75 wherein the input to said amplifying elements is maintained in a substantially dry environment so that nothing conductively connected to said sensing elements leaves the dry environment.

79. The electronic circuit of claim 68 wherein said integrated circuit has at least one guard ring on its surface around conductive elements connected to at least one said sensing element to intercept surface leakage currents and wherein said circuit further comprises elements for controlling the potential of said guard ring.

80. The electronic circuit of claim 79 wherein at least one said guard ring is sized to minimize coupling of voltages onto at least one said sensing element from conductors in other regions of the circuit.

81. The electronic circuit of claim 79 further comprising circuit elements connected to at least one of said sensing elements to minimize leakage currents by maintaining the voltage of at least one of said sensing elements to be substantially the same as at least one said guard ring.

82. The electronic circuit of claim 79 wherein at least one said sensing element is electrically connected to at least one said guard ring during manufacture and wherein said connection is broken prior to use of said circuit.

83. The electronic circuit of claim 82 wherein said connection is broken by a method selected from the group consisting of laser evaporation, chemical etching, mechanical breaking, or fuse blowing.

84. A method of using an electronic circuit to perform a measurement on charge, voltage or current created by at least one physical phenomenon occurring in a medium comprised of a material suitable for sensing said charge, voltage or current, wherein one or more circuits described in claim 1, 2, or 3 is utilized alone or in combination by electrically coupling said circuits together to minimize interfering currents in said measurement that cause said measurement to deviate from the actual level of charge, voltage or current being measured.

85. A method of using the electronic circuit of claim 84 wherein said measurements are accomplished without removal of accumulated charge from said sensing elements.

86. The method of using the electronic circuit of claim 84 further comprising:
   (a) using elements configured for reversing the polarity of an electric field to bring charge or current of alternating polarity to said sensing elements;
   (b) using elements configured for coupling a compensation signal to at least one said sensing element to reduce said voltage, current or charge below a level which permits additional measurements to be taken;
   (c) using elements configured for inducing current of an opposite polarity from said leakage current to flow to said sensing element in an amount controlled by said controller to minimize said inaccuracy,
   wherein said circuit uses one or more of (a), (b) or (c) in performing said measurement.

87. The electronic circuit of claim 86 wherein said measurements are accomplished without removal of accumulated charge from said sensing elements.

88. The electronic circuit of claim 1, 2 or 3 wherein none of said elements is located on an integrated circuit.

89. The electronic circuit of claim 2 further comprising at least two circuit elements selected from the group consisting of:
   (a) a guard element in association with said sensing element and configured to minimize leakage to said sensing element;
   (b) a charge pump circuit comprising a transistor coupled to said sensing element and configured for charge removal from said sensing element;
   (c) a charge pump circuit comprising a physical switch coupled to said sensing element and configured for charge removal from said sensing element;
   (d) a voltage reset circuit comprising a transistor coupled to said sensing element and configured for charge removal from said sensing element;
   (e) a voltage reset circuit comprising a physical switch coupled to said sensing element and configured for charge removal from said sensing element;
   (f) a compensating current source circuit coupled to said sensing element and configured to reduce said voltage, current or charge below a level which permits additional measurements to be taken,
   (g) duplicate circuit elements which are used to measure interfering currents and additional circuit elements coupled to said duplicate circuit elements which are configured to remove said interfering currents from said output signal;
   (h) circuit elements configured for controllably capacitively coupling charge to said sensing element;
   (i) circuit elements configured for reversing the polarity of the electric field acting in association with a portion of said sensing element to bring charge of the opposite polarity to the sensing element; or
   (j) circuit elements configured for inducing conductivity in or on an otherwise insulating material connected to said sensing element to bring charge of the opposite polarity to the sensing element,
   wherein said induced conductivity can be controllably caused by ionizing radiation, photoelectric emission, thermionic emission, field emission, corona discharge, high voltage breakdown, tunneling through an insulator, hot carrier emission into an insulator, or controlled conduction over the surface of an insulator.

90. The electronic circuit of claim 1, 3 or 89 wherein said two elements are substantially included on a single integrated circuit.

91. The electronic circuit of claim 1, 3 or 89 wherein said circuit incorporates at least a third element from said group.

92. The electronic circuit of claim 1, 3 or 89 wherein said three elements are substantially included on a single integrated circuit.

93. The electronic circuit of claim 1, 3 or 89, wherein at least one of said elements from said group can be permanently deactivated or deselected after manufacture of said electronic circuit.

94. The electronic circuit of claim 1, 3 or 89, wherein at least one of said elements from said group can be reversibly and controllably deactivated or deselected depending upon the operating condition of said electronic circuit.

95. The electronic circuit of claim 1, 2 or 3 wherein said circuit elements are configured to remove determined amounts of charge from said sensing elements to maintain the circuit in its operating range.

96. The electronic circuit of claim 95 further comprising circuit elements coupled to said output signal and configured for tracking the number of times charge is removed wherein said number is tracked as digital information and said measurement is a function of said number of times charge is removed or compensated.

97. The electronic circuit of claim 1, 2 or 3, wherein electronic circuit elements are configured to remove determined amounts of charge to maintain the circuit around a finite number of selected operating points.

98. The electronic circuit of claim 97 wherein said finite number of selected operating points is a single operating point.

99. The electronic circuit of claim 97, further comprising circuit elements configured for tracking the number of times charge is removed or compensated, wherein said number is tracked as digital information and said measurement is a function of said number of times charge is removed or compensated.

100. The electronic circuit of claim 66 wherein said guard ring potential follows said sensing element potential thereby reducing capacitance and increasing sensitivity.

101. The electronic circuit of claim 18 wherein reversing the polarity of said electric field affects an amplification of the output signal in comparison to the output signal if there had been no reversal.

102. The electronic circuit of claim 18 further comprising elements for varying a threshold against which said output signal is compared once said threshold has been reached to permit further measurements to be made.

103. The electronic circuit of claim 1, 2 or 3 further comprising multiple sensing elements wherein phase differences in said output signal or differences caused by a difference in the material used for each said sensing element are used to provide information about the signal to be measured.

104. The electronic circuit of claim 1, 2 or 3 wherein a shielding material separates the sensing electrode from other electric fields in the instrument.

105. The electronic circuit of claim 1, 2, or 3, further comprising
  (a) elements coupled to said sensing element and configured to remove charge packets
  (b) elements coupled to said charge removal elements and configured to control said removal of charge packets.

106. The electronic circuit of claim 1, 2, or 3 wherein said transistor is an insulated gate transistor.

107. The electronic circuit of claim 106 wherein said insulated gate transistor is manufactured without an electrical connection to a diode configured for protection of said gate from damage caused by static discharge.

108. The electronic circuit of claim 106 wherein said insulated gate transistor is operated without an electrical connection to a diode configured for protection of said gate from damage caused by static discharge.

109. An electronic circuit for measuring charge, voltage or current, comprising:
  (a) elements configured for sensing charge, voltage, or current to provide an output signal which is a function of the charge, voltage or current being measured;
  (b) elements configured for amplifying said output signal to provide said measurement; and
  (c) elements configured for measuring said charge, voltage, or current without a continuous discharge path;
  wherein said circuit elements are configured for performing said measurement on charge, voltage or current created by at least one physical phenomenon occurring in a medium comprised of a material suitable for sensing said charge, voltage or current; and
  wherein said measured charge or current is accumulated on at least one of said sensing elements under the influence of an electric field; and
  further comprising elements configured for reversing the polarity of said electric field to bring charge or current of alternating polarity to said sensing elements and
  further comprising elements configured for coupling a compensation signal to at least one said sensing element; and
  wherein said compensation signal is capacitively coupled to said sensing elements; and
  wherein a plurality of capacitors each couple a separate compensation signal to said sensing elements and wherein each said capacitor has a capacitance value that is twice and one-half the capacitance of the two other capacitors of closest value to permit each said compensation signal to be switched between two discrete levels.

110. An electronic circuit for measuring charge, voltage or current, comprising:
  (a) elements configured for sensing charge, voltage, or current to provide an output signal which is a function of the charge, voltage or current being measured;
  (b) elements configured for amplifying said output signal to provide said measurement;
  (c) elements configured for minimizing inaccuracies in said measurement that cause said measurement to deviate from the actual level of charge, voltage or current being measured;
  wherein said circuit elements are configured for performing said measurement on charge, voltage or current created by at least one physical phenomenon occurring in a medium comprised of a material suitable for sensing said charge, voltage or current; and
  wherein said measured charge or current is accumulated on at least one of said sensing elements under the influence of an electric field; and
  further comprising elements configured for reversing the polarity of said electric field to bring charge or current of alternating polarity to said sensing elements and
  further comprising elements configured for coupling a compensation signal to at least one said sensing element; and
  wherein said compensation signal is capacitively coupled to said sensing elements; and
  wherein a plurality of capacitors each couple a separate compensation signal to said sensing elements and wherein each said capacitor has a capacitance value that is twice and one-half the capacitance of the two other capacitors of closest value to permit each said compensation signal to be switched between two discrete levels.

111. An electronic circuit for measuring charge, voltage or current, comprising:
  (a) elements configured for sensing charge, voltage or current to provide an output signal which is a function of the charge, voltage or current being measured;
  (b) elements configured for amplifying said sensed charge, voltage or current to create said output signal;
  (c) elements configured for removing charge accumulated on said sensing elements to permit further measurements to be taken; and (d) elements configured for minimizing inaccuracies in said measurement that cause said measurement to deviate from the actual level of charge or current being measured;

wherein said circuit elements are configured for performing said measurement on charge, voltage or current created by at least one physical phenomenon occurring in a medium comprised of a material suitable for sensing said charge, voltage or current; and wherein said measured charge or current is accumulated on at least one of said sensing elements under the influence of an electric field; and further comprising elements configured for reversing the polarity of said electric field to bring charge or current of alternating polarity to said sensing elements and further comprising elements configured for coupling a compensation signal to at least one said sensing element; and wherein said compensation signal is capacitively coupled to said sensing elements; and wherein a plurality of capacitors each couple a separate compensation signal to said sensing elements and wherein each said capacitor has a capacitance value that is twice and one-half the capacitance of the two other capacitors of closest value to permit each said compensation signal to be switched between two discrete levels.

112. An electronic circuit for measuring charge, voltage or current, comprising:

(a) elements configured for sensing charge, voltage or current to provide an output signal which is a function of the charge, voltage or current being measured;

(b) elements configured for amplifying said sensed charge, voltage or current to create said output signal;

(c) elements configured for removing charge accumulated on said sensing elements to permit further measurements to be taken; and (d) elements configured for minimizing inaccuracies in said measurement that cause said measurement to deviate from the actual level of charge or current being measured;

wherein said charge removal is not continuous; and wherein said circuit further comprises elements configured for controlling said charge removal; and wherein said charge removal is in discrete packets and wherein the number of packets removed is representative of said measured charge and wherein the time rate of removal of said packets is representative of said measured current.

113. An electronic circuit for measuring charge, voltage or current, comprising:

(a) elements configured for sensing charge, voltage or current to provide an output signal which is a function of the charge, voltage or current being measured;

(b) elements configured for amplifying said sensed charge, voltage or current to create said output signal;

(c) elements configured for removing charge accumulated on said sensing elements to permit further measurements to be taken; and (d) elements configured for minimizing inaccuracies in said measurement that cause said measurement to deviate from the actual level of charge or current being measured;

wherein said charge removal is continuous; and wherein said circuit further comprises elements configured for controlling said charge removal; and wherein said charge removal is in discrete packets and wherein the number of packets removed is representative of said measured charge and wherein the time rate of removal of said packets is representative of said measured current.

114. An electronic circuit for measuring charge, voltage or current, comprising:

(a) elements configured for sensing charge, voltage, or current to provide an output signal which is a function of the charge, voltage or current being measured;

(b) elements configured for amplifying said output signal to provide said measurement; and (c) elements configured for measuring said charge, voltage, or current without a continuous discharge path;

wherein electronic circuit elements are configured to remove determined amounts of charge to maintain the circuit in its operating range; and further comprising circuit elements configured for tracking the number of times charge is removed wherein said number is provided as digital information.

115. An electronic circuit for measuring charge, voltage or current, comprising:

(a) elements configured for sensing charge, voltage, or current to provide an output signal which is a function of the charge, voltage or current being measured;

(b) elements configured for amplifying said output signal to provide said measurement;

(c) elements configured for minimizing inaccuracies in said measurement that cause said measurement to deviate from the actual level of charge, voltage or current being measured;

wherein electronic circuit elements are configured to remove determined amounts of charge to maintain the circuit in its operating range; and further comprising circuit elements configured for tracking the number of times charge is removed wherein said number is provided as digital information.

116. An electronic circuit for measuring charge, voltage or current, comprising:

(a) elements configured for sensing charge, voltage or current to provide an output signal which is a function of the charge, voltage or current being measured;

(b) elements configured for amplifying said sensed charge, voltage or current to create said output signal;

(c) elements configured for removing charge accumulated on said sensing elements to permit further measurements to be taken; and (d) elements configured for minimizing inaccuracies in said measurement that cause said measurement to deviate from the actual level of charge or current being measured;

wherein electronic circuit elements are configured to remove determined amounts of charge to maintain the circuit in its operating range; and further comprising circuit elements configured for tracking the number of times charge is removed wherein said number is provided as digital information.

117. An electronic circuit for measuring charge, voltage or current, comprising:

(a) elements configured for sensing charge, voltage, or current to provide an output signal which is a function of the charge, voltage or current being measured;

(b) elements configured for amplifying said output signal to provide said measurement; and (c) elements configured for measuring said charge, voltage, or current without a continuous discharge path;

wherein electronic circuit elements are configured to remove determined amounts of charge to maintain the circuit around a finite number of selected operating points.

118. An electronic circuit for measuring charge, voltage or current, comprising:

(a) elements configured for sensing charge, voltage, or current to provide an output signal which is a function of the charge, voltage or current being measured;

(b) elements configured for amplifying said output signal to provide said measurement;

(c) elements configured for minimizing inaccuracies in said measurement that cause said measurement to deviate from the actual level of charge, voltage or current being measured;

wherein electronic circuit elements are configured to remove determined amounts of charge to maintain the circuit around a finite number of selected operating points.

119. An electronic circuit for measuring charge, voltage or current, comprising:

(a) elements configured for sensing charge, voltage or current to provide an output signal which is a function of the charge, voltage or current being measured;

(b) elements configured for amplifying said sensed charge, voltage or current to create said output signal;

(c) elements configured for removing charge accumulated on said sensing elements to permit further measurements to be taken; and (d) elements configured for minimizing inaccuracies in said measurement that cause said measurement to deviate from the actual level of charge or current being measured;

wherein electronic circuit elements are configured to remove determined amounts of charge to maintain the circuit around a finite number of selected operating points.

120. The electronic circuit of claim 109, 110 or 111 wherein said circuit forms a capacitive digital to analog converter.

121. The electronic circuit of claim 112 or 113 wherein said charge removal is in consistent sized discrete packets.

122. The electronic circuit of claim 112 or 113 wherein said charge packet removal is implemented by two transistors connected in series between at least one said sensing element and a voltage source controlled so that only one said transistor conducts at a time and sequenced such that said packets are removed by said transistors and delivered to said voltage source.

123. The electronic circuit of claim 117, 118 or 119, wherein said finite number of selected operating points is a single operating point.

124. The electronic circuit of claim 117, 118 or 119, further comprising circuit elements configured for tracking the number of times charge is removed or compensated, wherein said number is provided as digital information.

125. The electronic circuit of claim 124 wherein said measurement is a function of said number of times charge is removed or compensated.

* * * * *